United States Patent
Kaneko

(10) Patent No.: US 8,164,118 B2
(45) Date of Patent: Apr. 24, 2012

(54) SEMICONDUCTOR DEVICE AND ITS MANUFACTURING METHOD

(75) Inventor: Nobuo Kaneko, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 104 days.

(21) Appl. No.: 12/641,637

(22) Filed: Dec. 18, 2009

(65) Prior Publication Data

US 2010/0163930 A1    Jul. 1, 2010

(30) Foreign Application Priority Data

Dec. 26, 2008  (JP) ................. 2008-334789

(51) Int. Cl.
*H01L 29/778* (2006.01)

(52) U.S. Cl. ................. 257/194; 257/E29.246

(58) Field of Classification Search .......... 257/194, 257/E21.159, E29.246
See application file for complete search history.

(56) References Cited

U.S. PATENT DOCUMENTS 7,601,993 B2   10/2009  Hoshi et al.

2005/0139838 A1*  6/2005  Murata et al. ............. 257/73
2005/0253167 A1* 11/2005  Wu et al. .................. 257/192

FOREIGN PATENT DOCUMENTS

JP      2007-165446 A    6/2007

* cited by examiner

*Primary Examiner* — Evan Pert
*Assistant Examiner* — Selim Ahmed
(74) *Attorney, Agent, or Firm* — Birch, Stewart, Kolasch & Birch, LLP

(57) ABSTRACT

An object of the present invention is to reduce on-state resistance and increases reliability in a semiconductor device having an electrode formed in a recessed structure. As illustrated in FIG. 1B, a first insulating layer 103 is formed. Then, as illustrated in FIG. 1C, a photolithography process is carried out to form a photoresist pattern 104. Subsequently, as illustrated in FIG. 1D, dry etching is applied to the first insulating layer 103. Then, as illustrated in FIG. 1E, a laminated semiconductor structure is etched. Next, in this state, wet etching is applied to the first insulating layer 103 as illustrated in FIG. 1F. Next, in this state, an electrode material 105 is formed on the entire exposed surface as illustrated in FIG. 1G. Finally, as illustrated in 1H, the photoresist pattern 104 is removed.

6 Claims, 30 Drawing Sheets

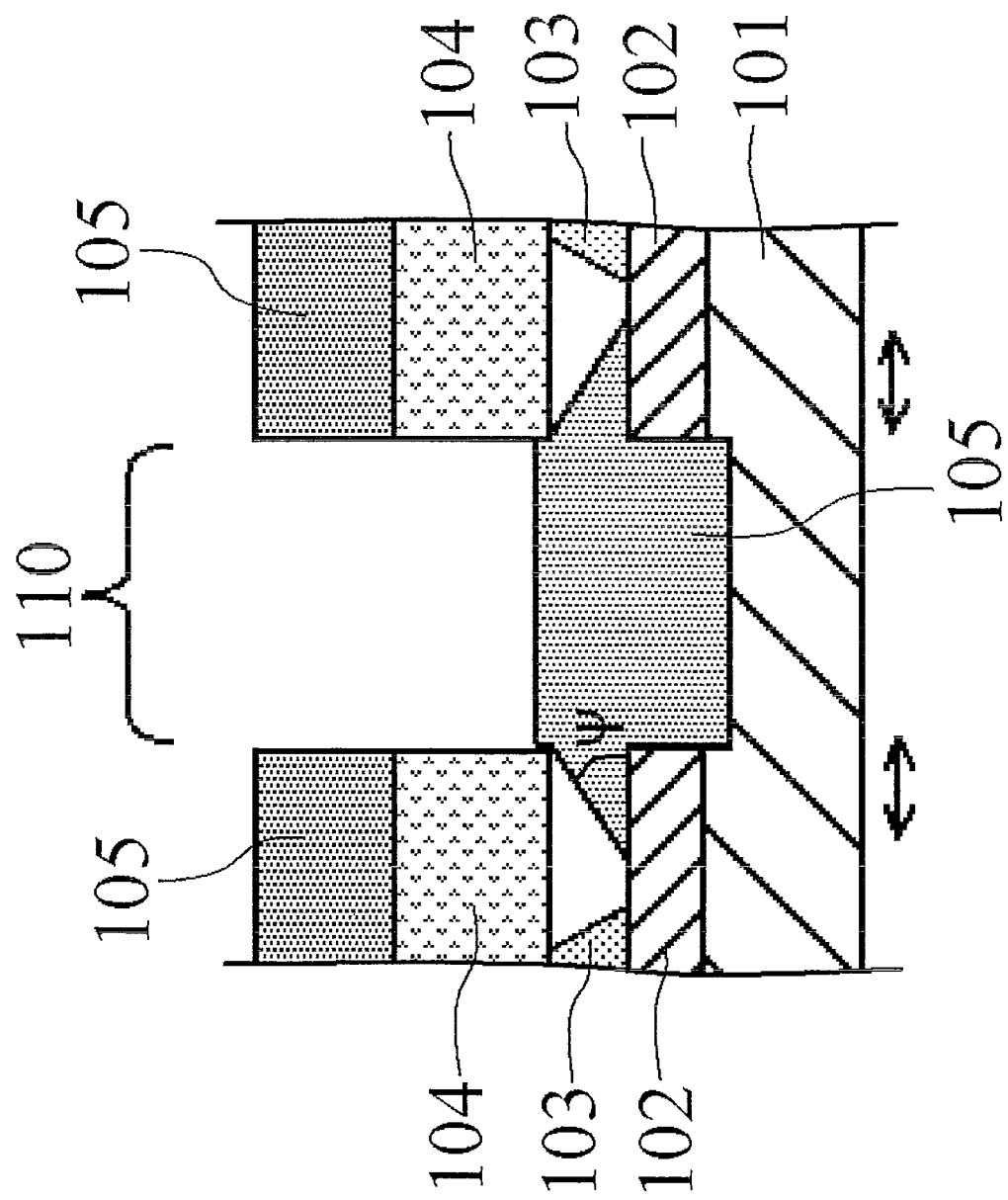

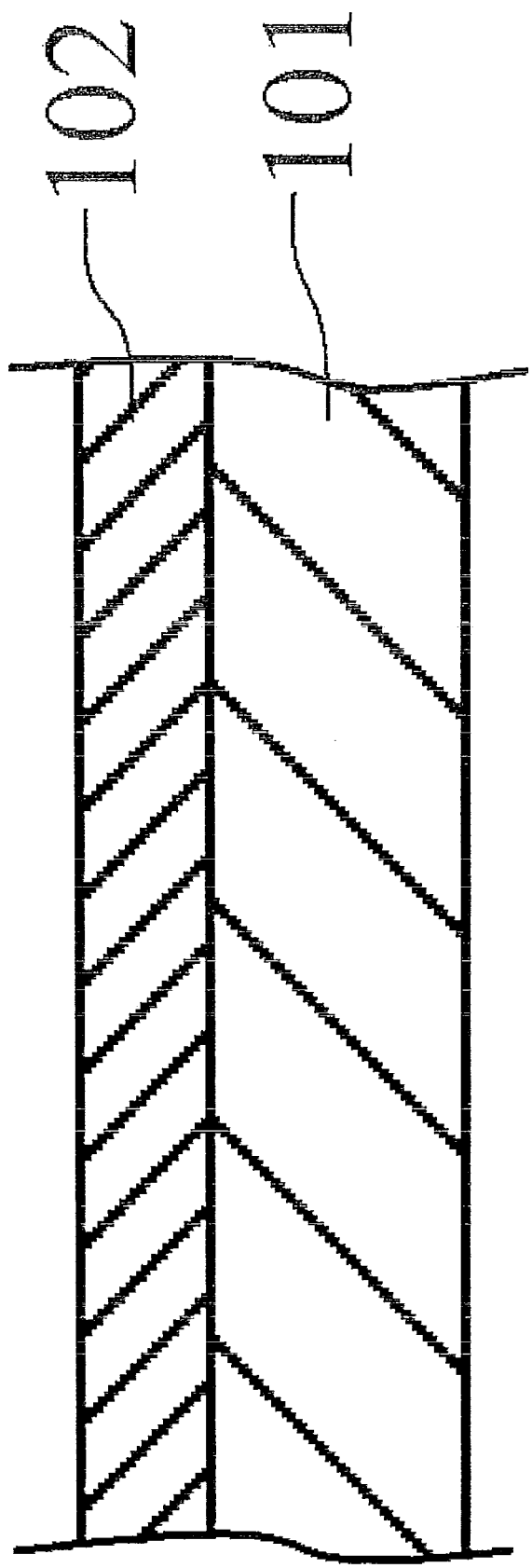

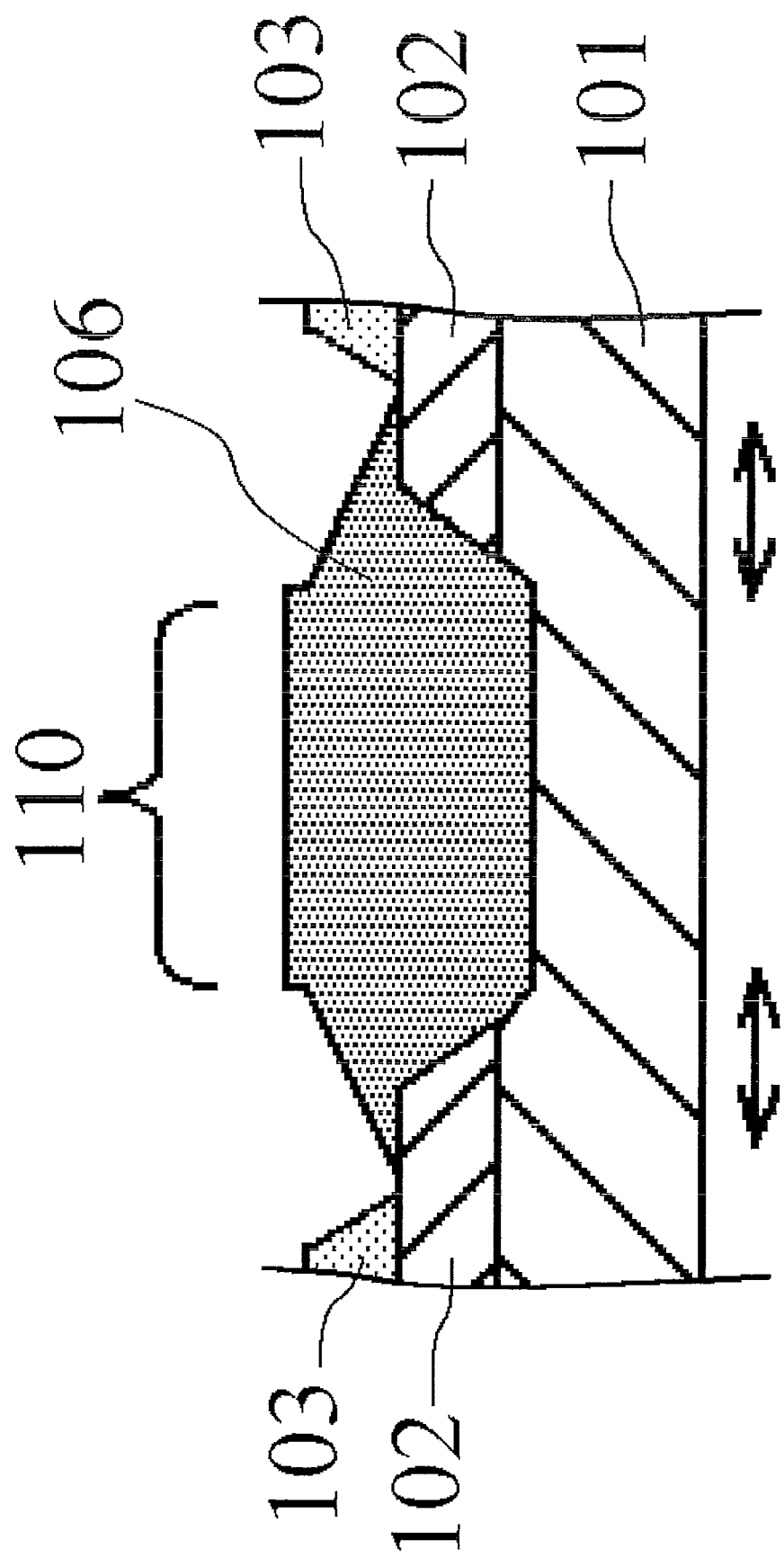

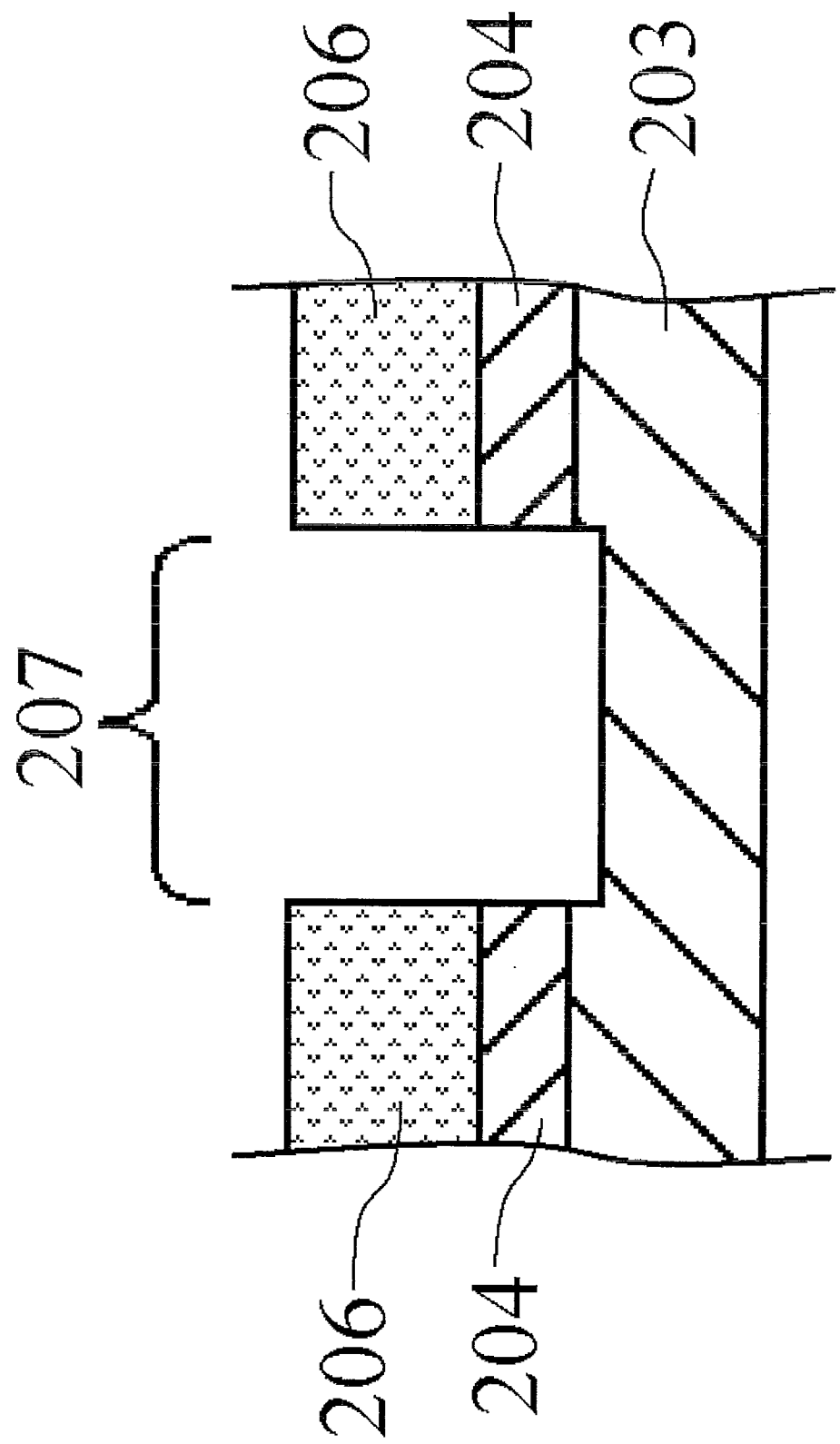

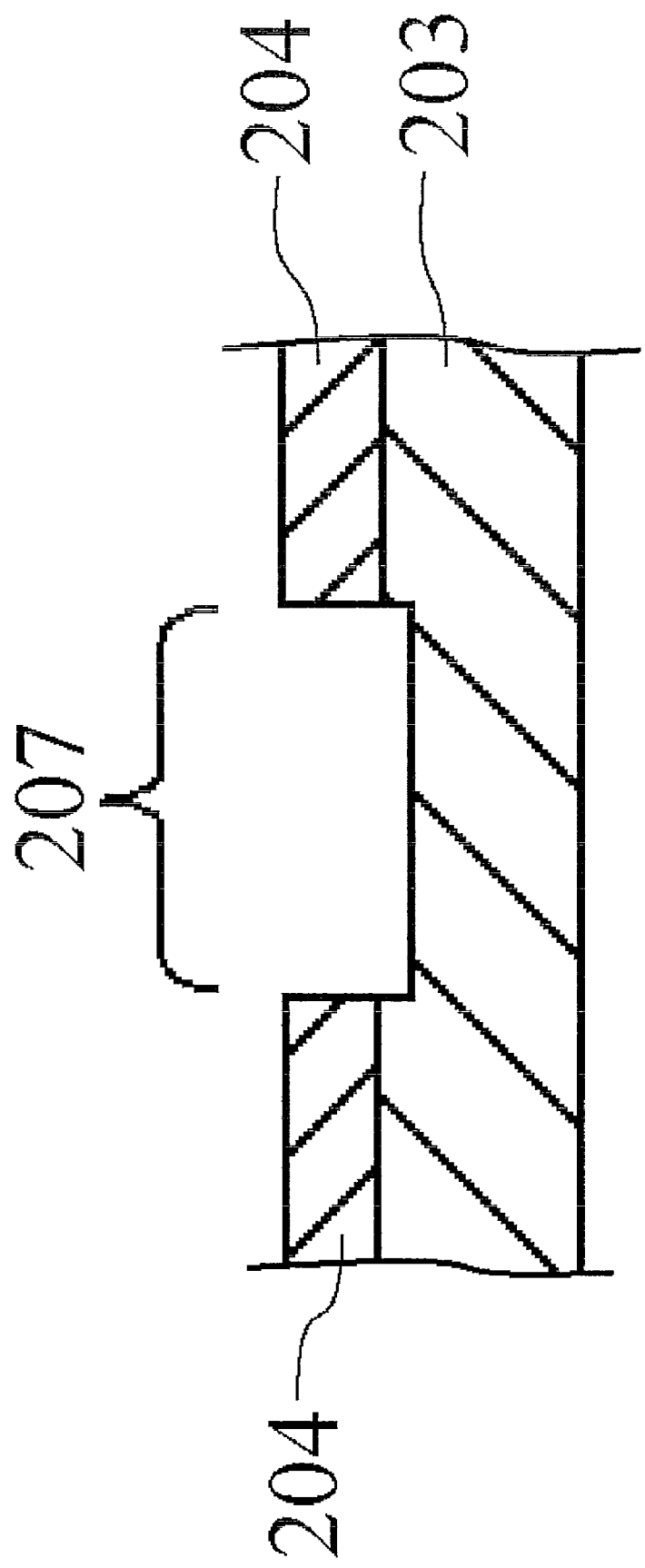

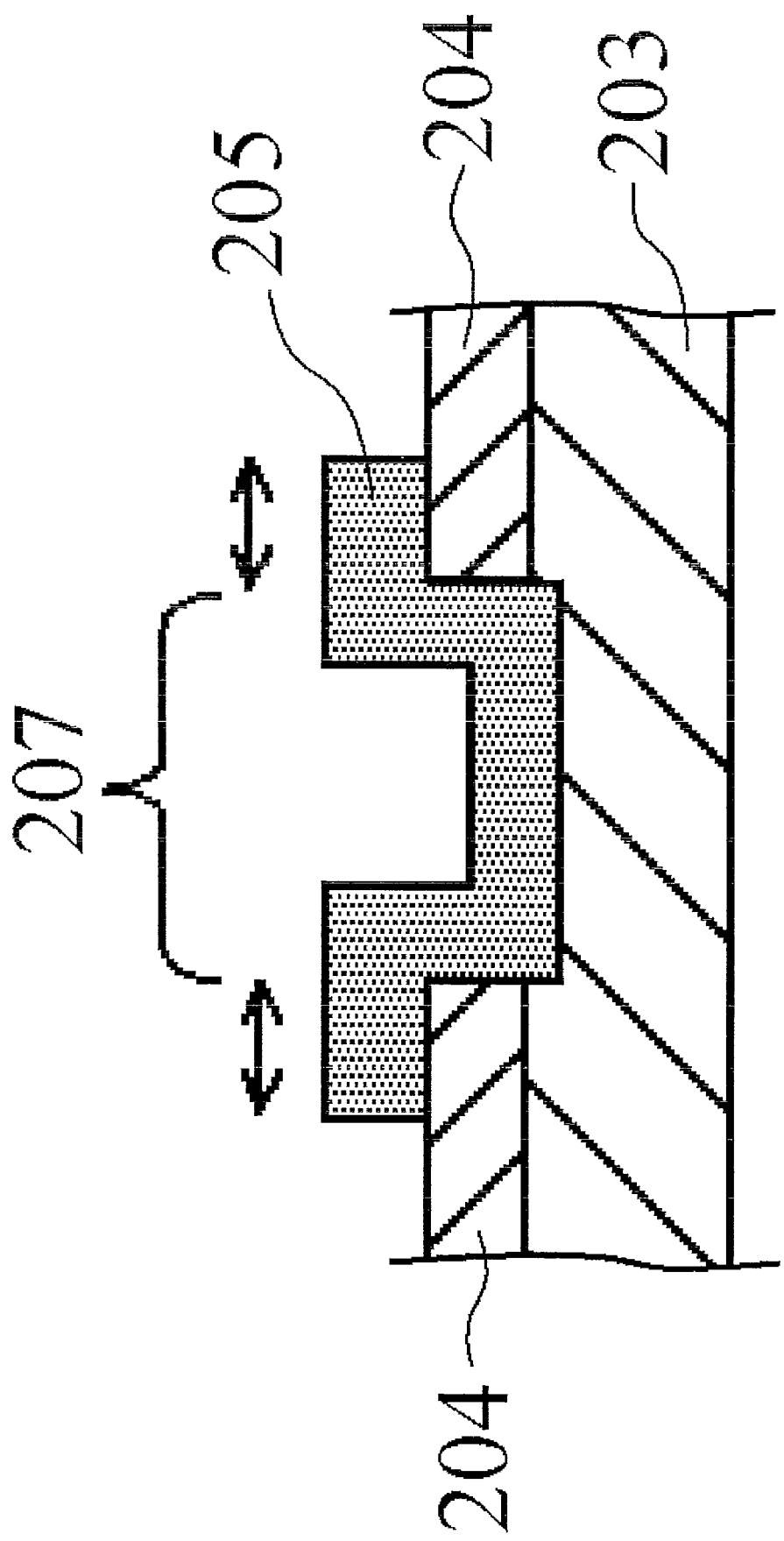

SEMICONDUCTOR DEVICE AND ITS MANUFACTURING METHOD

BACKGROUND OF THE INVENTION

1. Field of the Invention

The present invention relates to a semiconductor device manufacturing method and, more particularly, to a manufacturing method of a semiconductor device including an electrode formed in a recessed structure and the semiconductor device.

2. Description of the Related Art

There is known an HEMT (High Electron Mobility Transistor) as a high speed transistor. The HEMT is a transistor capable of operating at high-speed by a configuration where a two-dimensional electron gas is formed in a laminated semiconductor structure by utilizing a compound semiconductor heterojunction so as to increase the mobility of electron. In the HEMT, the two-dimensional electron gas does not flow on the outermost surface in the laminated semiconductor structure but flows near the interface of the laminated semiconductor structure, so that a contact with a drain and a source needs to be formed in the laminated semiconductor structure so as to be connected directly to the interface.

FIG. 5 is a cross-sectional view illustrating a representative configuration of the contact structure in the source or drain region in the HEMT. The HEMT illustrated in FIG. 5 uses a wide band gap GaN to meet high power requirements. A buffer layer 202 is formed on a substrate 201 made of monocrystalline silicon or the like by epitaxial growth, and a GaN layer 203 serving as a channel layer is formed by epitaxial growth on the buffer layer 202. On the GaN layer 203, an AlGaN layer 204 serving as a carrier supply layer is formed by epitaxial growth. At this time, an abrupt junction is formed at the interface between the GaN layer and AlGaN layer so as to allow formation of the two-dimensional electron gas. The two-dimensional electron gas is formed very thin on the GaN side of the interface, and the electrons in this layer exhibit considerably high mobility. Note that there is also a case where a cap GaN layer is formed on the AlGaN layer 204.

The two-dimensional electron gas is formed only near the interface between the GaN layer 203 and AlGaN layer 204. Therefore, in order to make a contact (electrical contact) with the two-dimensional electron gas, etching is performed deeply enough to a portion below the interface to form a recessed portion (recessed region) for subsequent formation of an electrode 205 in the recessed portion. FIGS. 6A to 6G are process cross-sectional views illustrating an example of a manufacturing process of this structure. The illustrations of the substrate 201 and buffer layer 202 are omitted here.

As illustrated in FIG. 6A, a photoresist pattern 206 having an opening at a portion at which the recessed region is formed by photolithography on the laminated semiconductor structure of the GaN layer 203 and AlGaN layer 204. Then, as illustrated in FIG. 6B, the AlGaN layer 204 and GaN layer 203 are removed by dry etching using the photoresist pattern 206 as a mask, and the photoresist pattern 206 is removed, whereby a recessed region 207 as illustrated in FIG. 6C is formed. As a result, the GaN/AlGaN interface is exposed from the side surface of the recessed region 207. Then, after an electrode material 208 is formed over the entire resultant exposed surface as illustrated in FIG. 6D, a photoresist pattern 209 is formed by lithography as illustrated in FIG. 6E. Then, as illustrated in FIG. 6F, dry etching is applied to the electrode material 208 using the photoresist pattern 209 as a mask. After removal of the photoresist pattern 209, an electrode 205 having a predetermined pattern is obtained as illustrated in FIG. 6G. Note that the gate of the HEMT is formed outside the region illustrated in FIGS. 5 and 6.

In order to reduce the on-state resistance of the HEMT, a contact resistance in the source or drain needs to be reduced. Thus, a reduction in a variation of the contact resistance or resistance value between the two-dimensional electron gas and electrode 205 is required. However, in this structure, the contact area between the electrode and layer (two-dimensional electron gas layer) through which current flows is considerably smaller than in a general MOSFET (Metal Oxide Semiconductor Field Effect Transistor) using an electrical contact with the surface of the source or drain. Therefore, it is not easy to reduce a variation of the contact resistance or resistance value.

In order to cope with the above situation, Japanese Patent Application No. JP-A-2007-165446 (Patent Document 1) discloses a technique in which many concavities and convexities are formed on the side surface (surface at which the electrode 205 and GaN/AlGaN layers 203, 204 contact each other) of the recessed region in FIG. 5. This structure allowed the contact area between the electrode and two-dimensional electron gas layer to be substantially increased, thereby reducing a variation of the contact resistance or resistance value in the source or drain.

However, in order to achieve the above structure including the technique disclosed in Patent Document 1, two photolithography processes are required in total for formation of the recessed region 207 and electrode 205 as illustrated in FIGS. 6A to 6G. Especially, in the lithography (FIG. 6E) for formation of the electrode 205, it is necessary to achieve alignment with the recessed region 207 that has already been formed with sufficient accuracy. When the positions of the electrode 205 and recessed region 207 are displaced from each other due to poor accuracy of the alignment, contact between the electrode 205 and two-dimensional electron gas layer becomes incomplete in some cases, which may accordingly increase the resistance of this portion to degrade the reliability of the device.

As a result, it is necessary to make the width of the electrode 205 larger than that of the recessed region 207 in accordance with the alignment accuracy by an amount corresponding to, e.g., the width of regions (overlapping regions) indicated by two-headed arrows of FIG. 6G. For example, the overlapping regions each have a width of 2 μm. In this case, it is necessary to set the interval (interval between the side surface of the recessed region 207 in the source and side surface of the recessed region 207 in the drain) between the source and drain to a larger value, with the result that the on-state resistance is increased.

The same can be said for the structure disclosed in Patent Document 1. Further, in the case of the structure of Patent Document 1, current concentrates on the portion at which the interval between the concavities and convexities on the edge surface of the recessed region in the source and concavities and convexities on the edge surface of the recessed region in the drain becomes small, causing a reduction in reliability on prolonged use.

Thus, in a semiconductor device having an electrode formed in the recessed structure, it has been difficult to reduce the on-state resistance and increase reliability of the device.

SUMMARY OF THE INVENTION

The present invention has been made in view of the above problems, and an object thereof is to provide an invention solving the above problems.

In order to solve the above problems, the present invention is configured as follows.

A semiconductor device manufacturing method is a semiconductor device manufacturing method forming an electrode in a recessed structure formed in a semiconductor layer, the method including: a first insulating layer formation process, forming a first insulating layer on the surface of the semiconductor layer; a lithography process, forming a photoresist pattern having an opening on the first insulating layer; a semiconductor etching process, etching the semiconductor layer using the photoresist pattern and first insulating layer as a mask to form the recessed structure in the opening; an electrode film formation process, forming a film of an electrode material; and a lift-off process, removing the photoresist pattern to pattern the electrode material so as to form the electrode, wherein an insulating layer side etching process, making an wider opening of the first insulating layer than the opening of the photoresist where the opening of the photoresist is formed, is performed between the lithography process and the electrode film formation process.

The semiconductor device manufacturing method according to the present invention includes further, an insulating layer etching process, etching the first insulating layer using a dry etching method, between the lithography process and the semiconductor etching process, wherein the insulating layer side etching process is performed between the semiconductor etching process and the electrode film formation process.

In the semiconductor device manufacturing method according to the present invention, the insulating layer side etching process is performed between the lithography process and the semiconductor etching process.

In the semiconductor device manufacturing method according to the present invention, the insulating layer side etching process is performed, so that the first insulating layer is etched by a wet etching method.

The semiconductor device manufacturing method according to the present invention includes further, a cleaning process, cleaning the semiconductor layer in the recessed structure, between the semiconductor etching process and the electrode film formation process.

The semiconductor device manufacturing method according to the present invention includes further, a second insulating layer formation process, forming a second insulating layer on the electrode after the lift-off process.

In the semiconductor device manufacturing method according to the present invention, thermal treatment is performed after the second insulating layer formation process.

In the semiconductor device manufacturing method according to the present invention, the film of the electrode material is formed by an evaporation method in the electrode film formation process.

In the semiconductor device manufacturing method according to the present invention, the semiconductor layer has a laminated structure, and the electrode is connected to the interface in the laminated structure.

A semiconductor device according to the present invention is a semiconductor device in which an electrode is embedded in a recessed structure formed in a semiconductor layer, wherein the electrode includes: a bottom surface portion contacting the bottom surface of the recessed structure; a side surface portion contacting the side surface of the recessed structure; an upper surface portion having a flat portion opposed to the bottom surface portion and existing at the upper side; and a tapered portion extending from the periphery of the upper surface portion toward the upper surface of the semiconductor layer, in which the height of surface of the electrode becomes lower toward the outer periphery.

In the semiconductor device according to the present invention, the semiconductor layer has a laminated structure including a channel layer in which a two-dimensional electron gas is formed and a carrier supply layer having a lattice constant smaller than that of the channel layer.

In the semiconductor device according to the present invention, the electrode is used for electrical contact to the two-dimensional electron gas.

In the semiconductor device according to the present invention, the bottom surface portion is formed in the channel layer.

In the semiconductor device according to the present invention, the angle between the side surface portion and bottom surface portion is substantially vertical.

In the semiconductor device according to the present invention, the taper angle between the side surface portion and bottom surface portion is in the range of 20° to 80°.

In the semiconductor device according to the present invention, the tapered portion lies adjacent to the side surface portion and upper surface portion.

In the semiconductor device according to the present invention, the thickness of the electrode becomes maximum at the flat portion.

With the present invention having the above configuration, it is possible to reduce on-state resistance and increases reliability in the semiconductor device having an electrode formed in the recessed structure.

BRIEF DESCRIPTION OF THE DRAWINGS

FIGS. 1A to 1I are process cross-sectional views illustrating a manufacturing method according to a first embodiment of the present invention;

FIGS. 3A to 3H are process cross-sectional views illustrating a manufacturing method according to a second embodiment of the present invention;

FIGS. 6A to 6G are process cross-sectional views illustrating an example of a conventional manufacturing method of a semiconductor device.

DESCRIPTION OF THE PREFERRED EMBODIMENTS

A manufacturing method of an HEMT (High Electron Mobility Transistor) which is a preferred embodiment for practicing a manufacturing method of a semiconductor device according to the present invention will be described below. Hereinafter, only a structure of the source or drain of the HEMT will be described. The structure and manufacturing method of other portions, such as a portion near the gate, are the same as those of the conventionally known HEMT disclosed in Patent Document 1. In this semiconductor device, an electrode embedded in a recessed structure is used.

First Embodiment

Figure 1A:
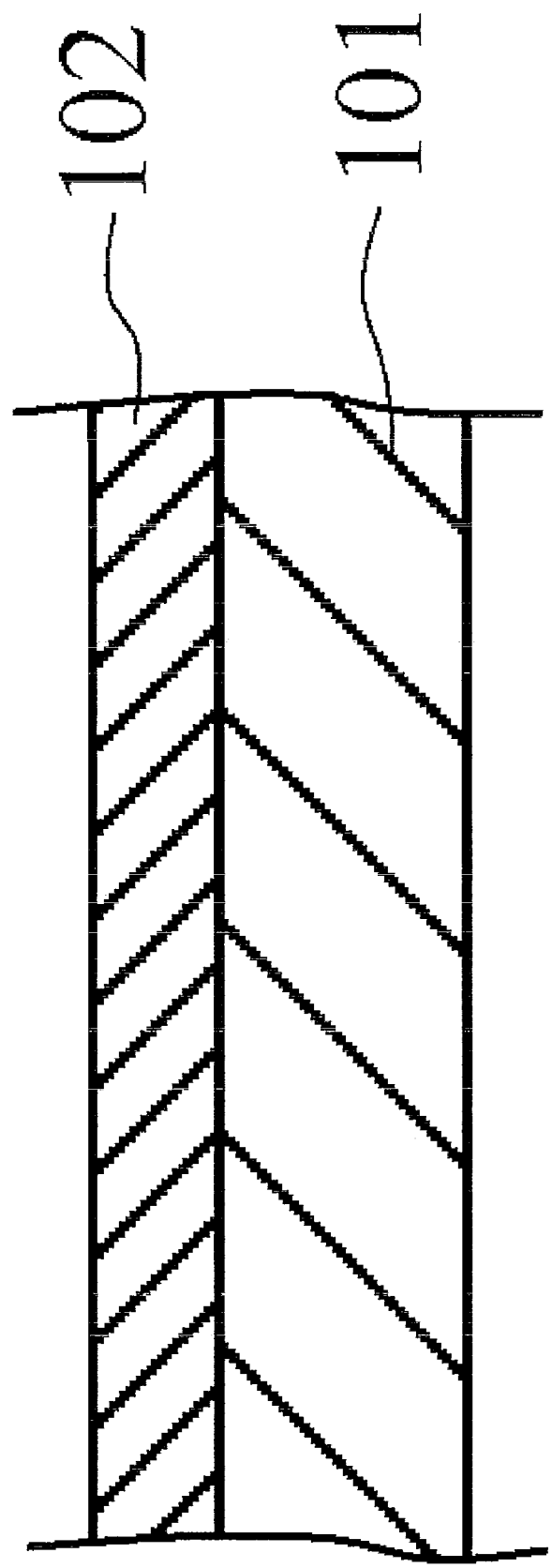
Figure 5:
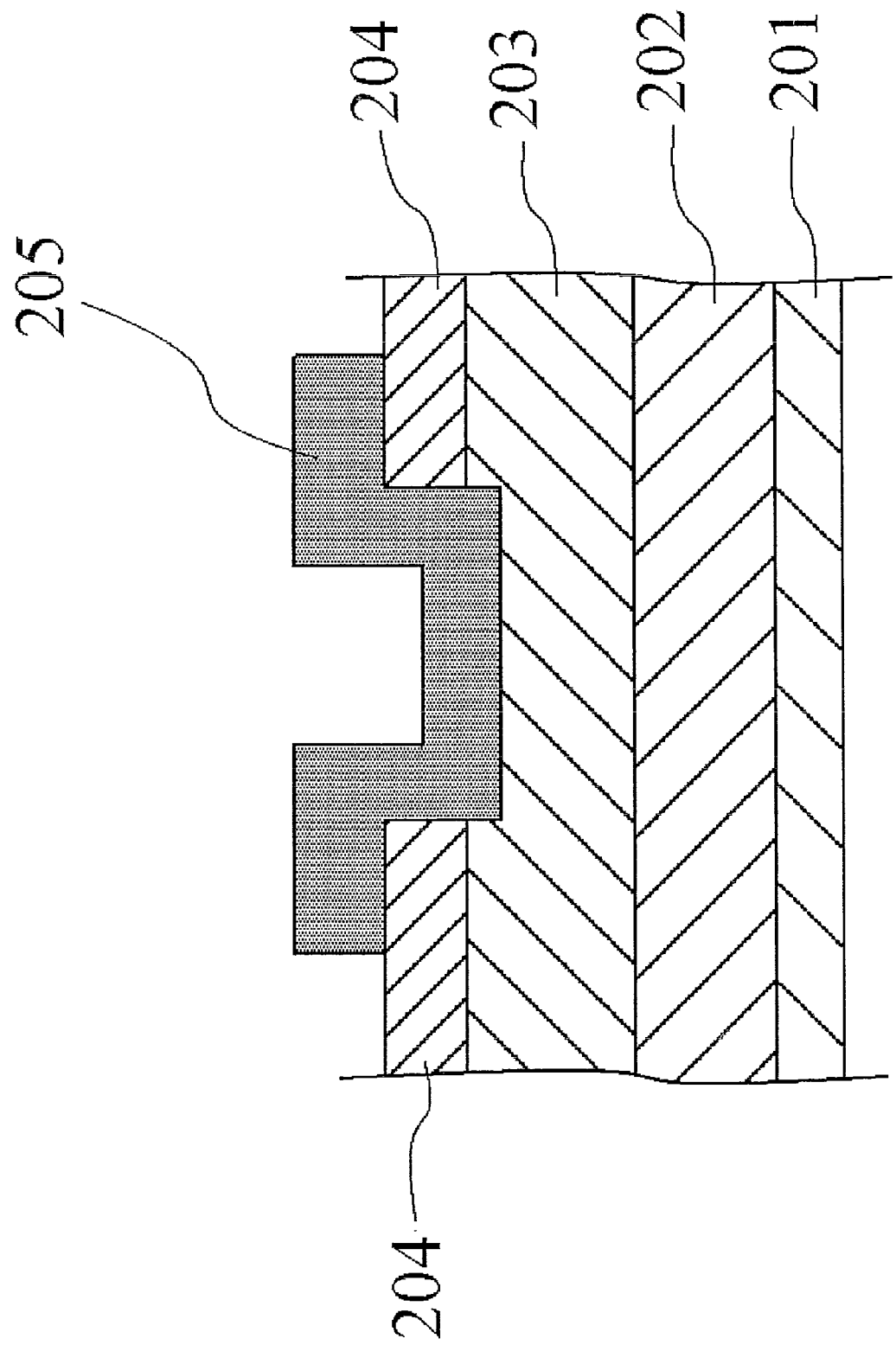
FIG. 5 is a cross-sectional view illustrating a structure of a conventional semiconductor device.

FIGS. 1A to 1I are process cross-sectional views of a structure around the source or drain of the manufacturing method according to a first embodiment. In the first step of the manufacturing method of this HEMT, a laminated semiconductor structure (semiconductor layer) in which an AlGaN layer 102 serving as a carrier supply layer is formed on a GaN layer 101 serving as a channel layer by a MOCVD (Metal Organic Chemical Vapor Deposition) method is produced as illustrated in FIG. 1A. Although the GaN layer 101 is formed on a silicon substrate through a buffer layer as in the case illustrated in FIG. 5, the illustration thereof is omitted here. The silicon substrate is a monocrystalline silicon substrate having a sufficient size. The buffer layer is used as needed for forming the GaN layer 101 with a less crystal defect on the silicon substrate having a lattice constant different from that of GaN. The buffer layer may be formed in a multilayered structure. The formation of the buffer layer on the silicone substrate and formation of the GaN layer 101 on the buffer layer can also be carried out by the MOCVD method. The GaN layer 101 is non-doped layer or partially doped layer having impurities on a part thereof. The thickness of the GaN layer 101 is about 0.5 μm to 10 μm. The AlGaN layer 102 is, to be exact, a mixed crystal of $Al_xGa_{1-x}N$ (x=0.1 to 0.4) and has a thickness of about 5 nm to 50 nm. The AlGaN layer 102 has a lattice constant smaller than that of the GaN layer 101 and a high electron concentration. Further, the band gap of the AlGaN layer 102 is larger than that of the GaN layer 101, so that the conduction band energy of the GaN layer 101 and AlGaN layer 102 becomes discontinuous at their interface, causing a region in which the conduction band energy is low to be formed locally, whereby a two-dimensional electron gas is formed at the interface. While the electron is supplied from the AlGaN layer 102 at the interface, the two-dimensional electron gas is formed on the GaN layer 101 side. The GaN layer 101 is non-doped in the vicinity of the interface and has few electron scattering sources, so that high electron mobility can be obtained. The configurations described above are the same as those conventionally known.

Figure 1B:
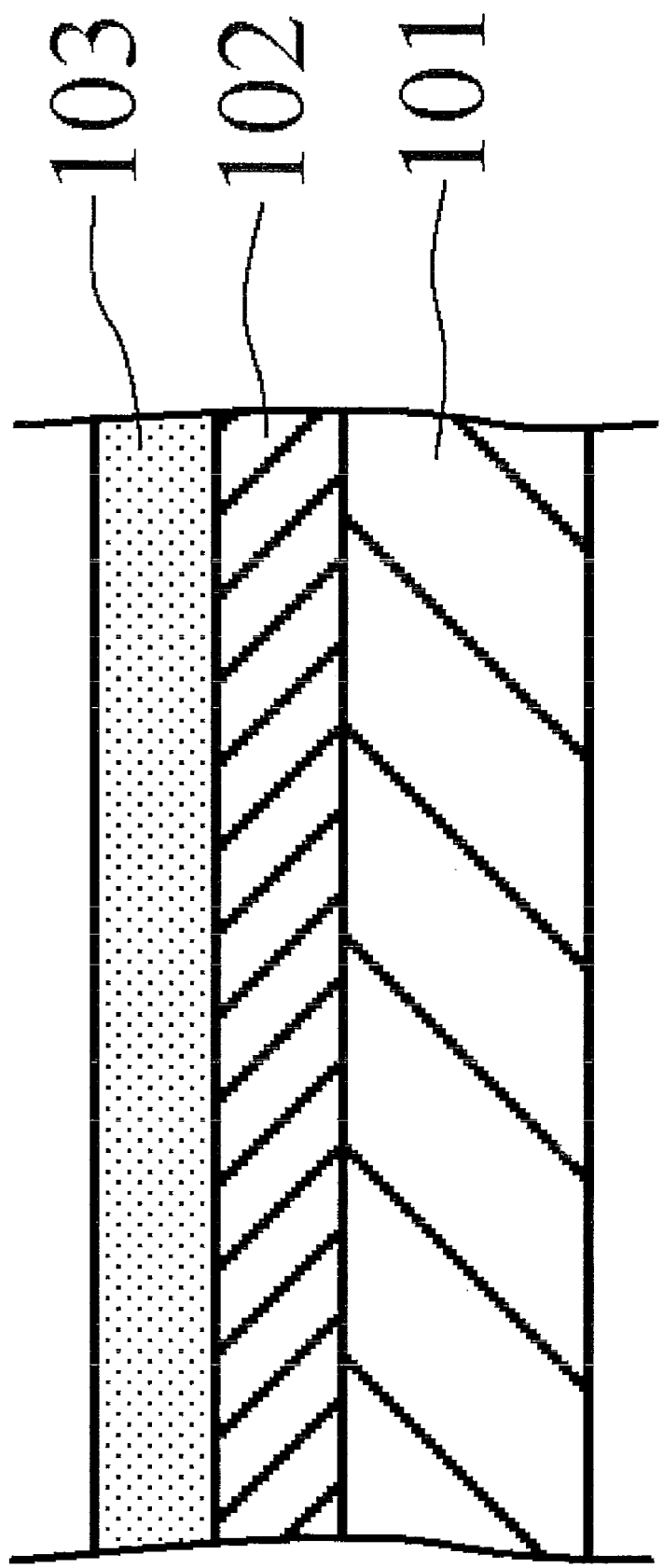

Then, as illustrated in FIG. 1B, a first insulating layer 103 is formed on the entire exposed surface (first insulating layer formation process). The first insulating layer 103 is made of, e.g., $SiO_x$ (x=1 to 2), has a thickness of about 250 nm, and exhibits satisfactory insulating properties. The formation of the first insulating layer 103 can be carried out by using a plasma CVD method at a temperature that does not adversely affect the GaN layer 101 and AlGaN layer 102.

Figure 1C:
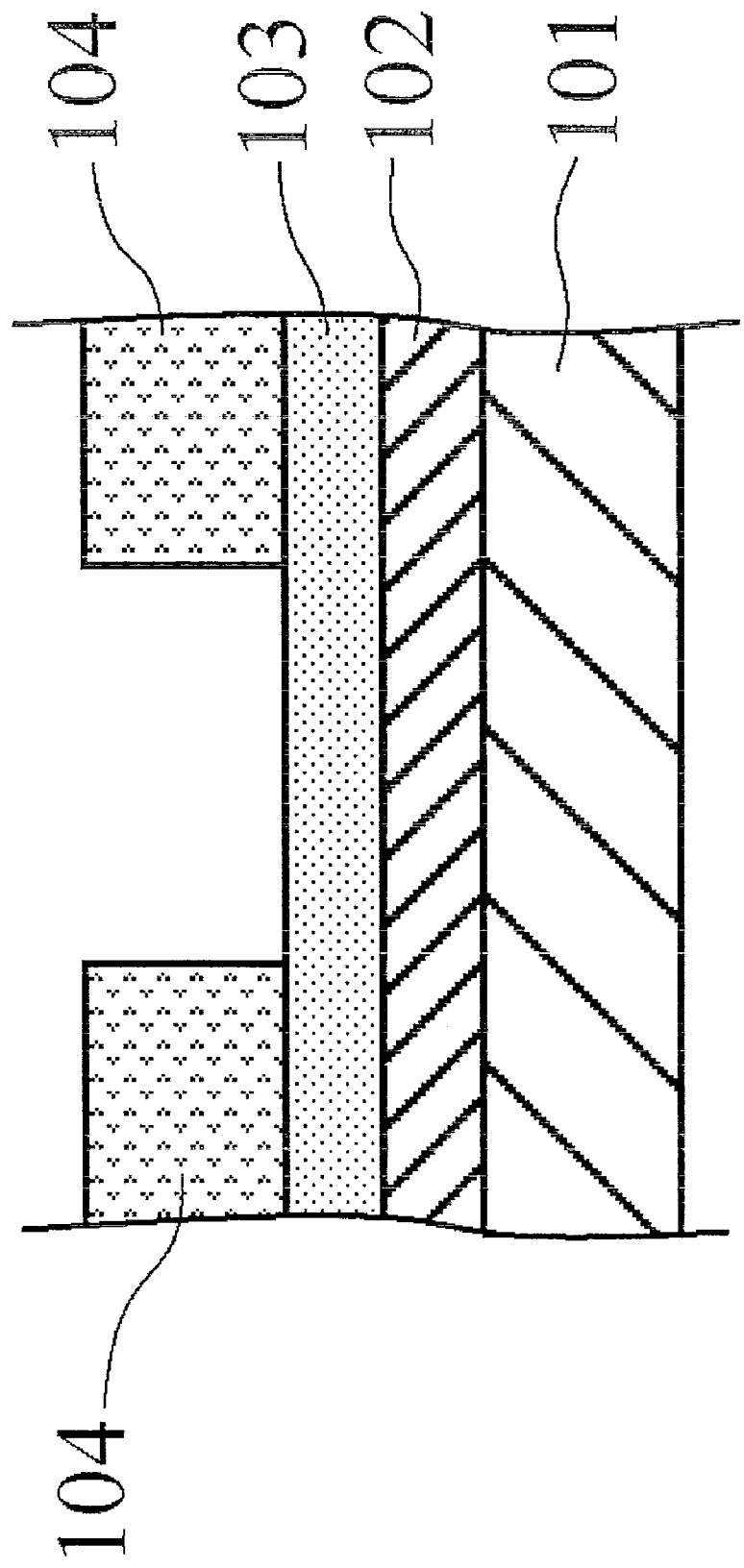

Then, as illustrated in FIG. 1C, a photolithography process is carried out to form a photoresist pattern 104 (lithography process). The photoresist pattern 104 has an opening that exposes the portion at which a recessed region is to be formed. The width of the opening is, e.g., about 7.5 μm. The thickness of the photoresist pattern 104 is set to 0.5 μm to 5.0 μm so as to withstand the subsequent dry etching process and, more preferably, to 1.0 μm to 2.0 μm.

Figure 1D:
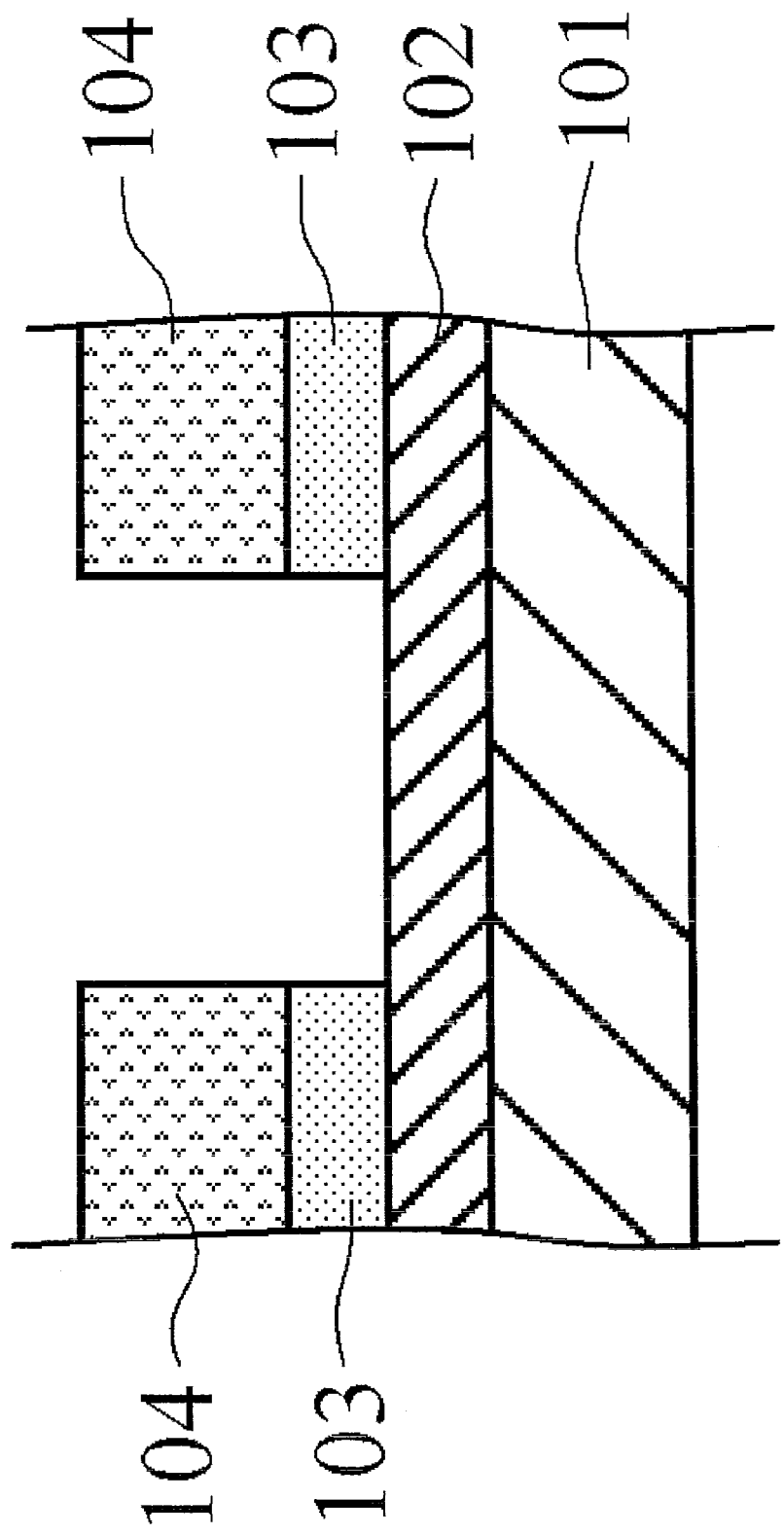

Then, as illustrated in FIG. 1D, the dry etching is applied to the first insulating layer 103 (insulating layer etching process). This etching is performed by dry etching using a fluorine-based etching gas such as $CF_4$ and can be completed with high selectivity with respect to a photoresist or AlGaN. With the insulating layer etching process, an opening is formed in the first insulating layer 103 at the portion at which the recessed region is to be formed. Further, this dry etching has a high anisotropy and therefore proceeds only downward in the drawing, allowing the etched cross-sectional shape of the side surface to be substantially vertical as illustrated in the drawing.

Figure 1E:
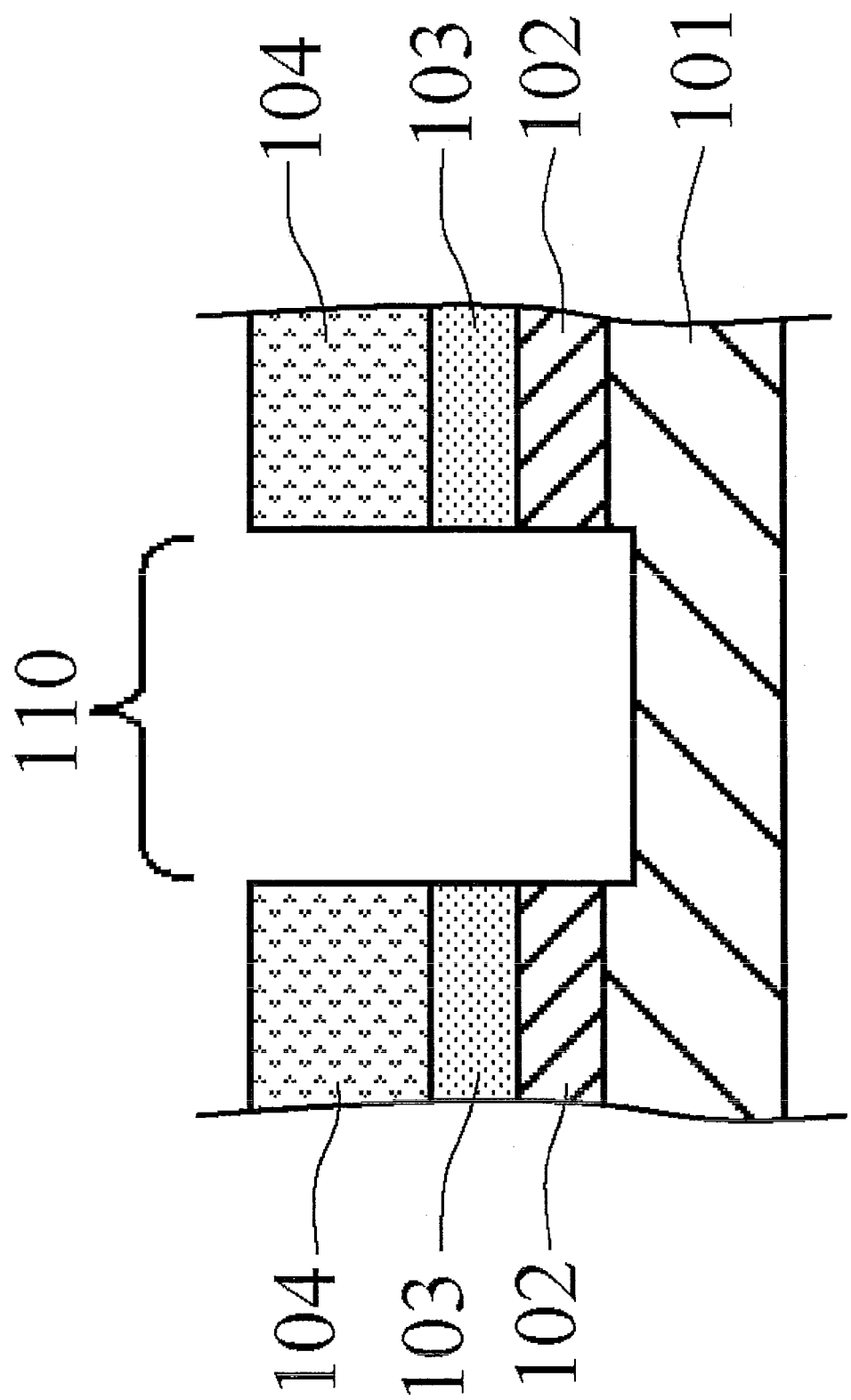

Then, as illustrated in FIG. 1E, the laminated semiconductor structure of the AlGaN layer 102 and GaN layer 101 is etched to form the recessed structure (semiconductor etching process). This etching is performed by dry etching using an etching gas different from that used in the insulating layer etching process, such as a chlorine-based gas and can be completed with high selectivity with respect to a photoresist or $SiO_x$. Different etching gases may be used to etch the AlGaN layer 102 and GaN layer 101. Alternatively, the same etching gas may be used to continuously etch the first insulating layer 103, AlGaN layer 102, and GaN layer 101 in the processes illustrated in FIGS. 1D and 1E. The GaN layer 101 is etched until the recessed structure in a recessed region 110 has a desired depth, i.e., the interface between the AlGaN layer 102 and GaN layer 101 is sufficiently exposed. At this time, emission analysis is used to determine that the etching has reached the interface between the AlGaN layer 102 and GaN layer 101 and to control the time employed in the subsequent etching, whereby the depth of the recessed region can be set at, e.g., 12 nm below the interface. With the above procedure, the recessed region 110 is obtained. The above dry etching has also a high anisotropy and therefore proceeds only downward in the drawing, allowing the etched cross-sectional shape of the side surface to be substantially vertical as illustrated in the drawing. Therefore, the width of the bottom surface which is a flat portion of the recessed region 110 can be made substantially equal to the width of the opening in the photoresist pattern 104.

Since there may be a case where an etching product adheres to the side surface of the recessed region 110 after the dry etching, it is preferable to perform a cleaning process such as dry cleaning (ashing) or wet cleaning using diluted aqua regia so as to remove the etching product in the recessed structure. Especially, in the case where the wet etching has been performed, it is possible to remove the etching product without influencing the photoresist pattern 104.

Figure 1F:
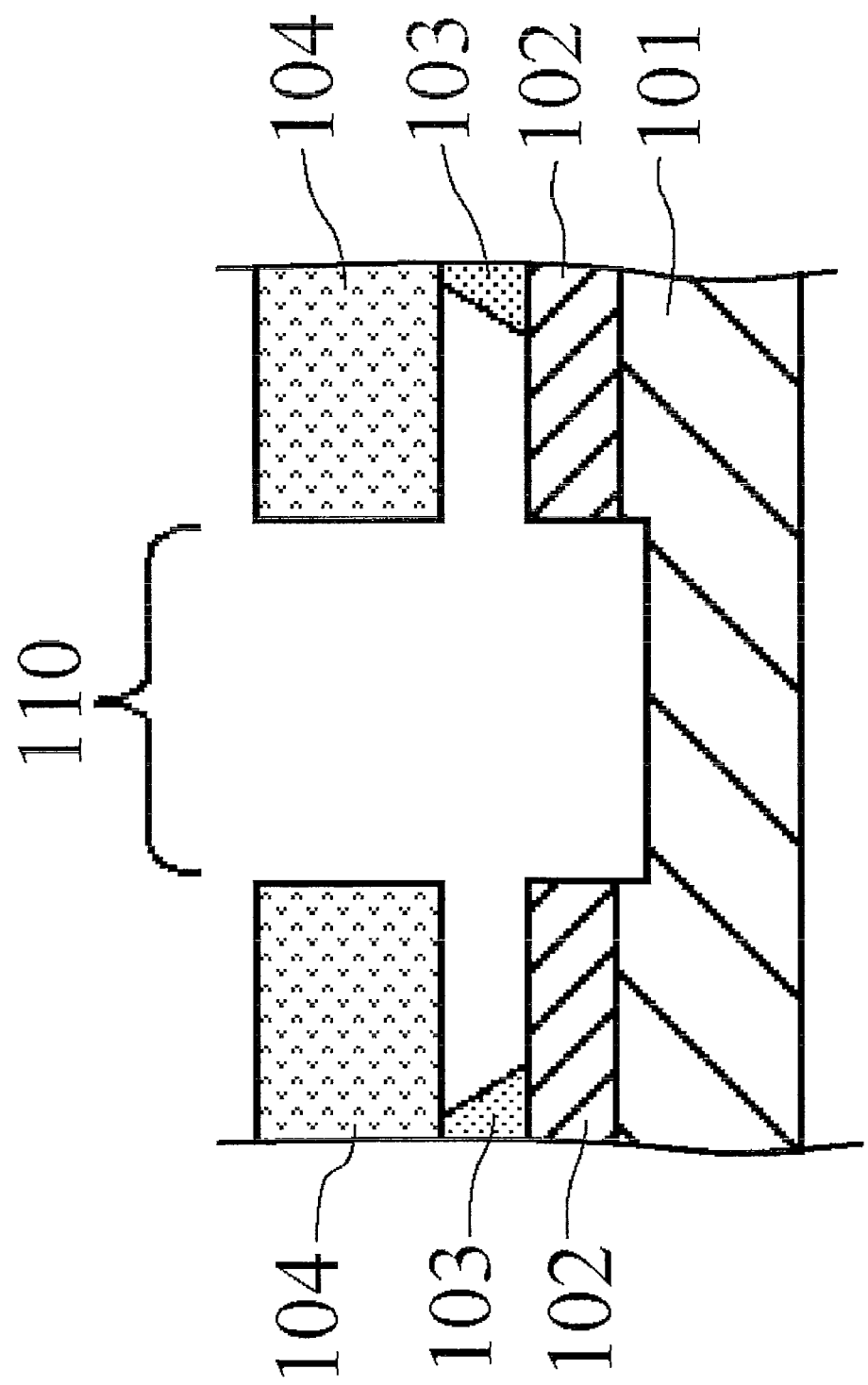

Then, in this state, wet etching is applied to the first insulating layer 103 (insulating layer side etching process) as illustrated in FIG. 1F. This process can be achieved by using fluorine-based etching solution (e.g., buffered hydrofluoric acid). Unlike the above dry etching, the etching employed in this process is not anisotropic, so that side etching proceeds in the horizontal direction. Therefore, the first insulating layer 103 exposed horizontally is side-etched toward the outside of the recessed region 110 in the drawing, making the opening formed in the first insulating layer 103 wider than the opening in the photoresist pattern 104, as illustrated in FIG. 1F. Note that, at this time, the AlGaN layer 102, GaN layer 101, and photoresist pattern 104 are hard to be influenced by the etching solution employed in this process. The amount of the side etching can be controlled by the etching time and can be set to, e.g., about 0.3 μm to 1.0 μm. With the above procedure, a hollow space is formed under the photoresist pattern 104.

Figure 6A:
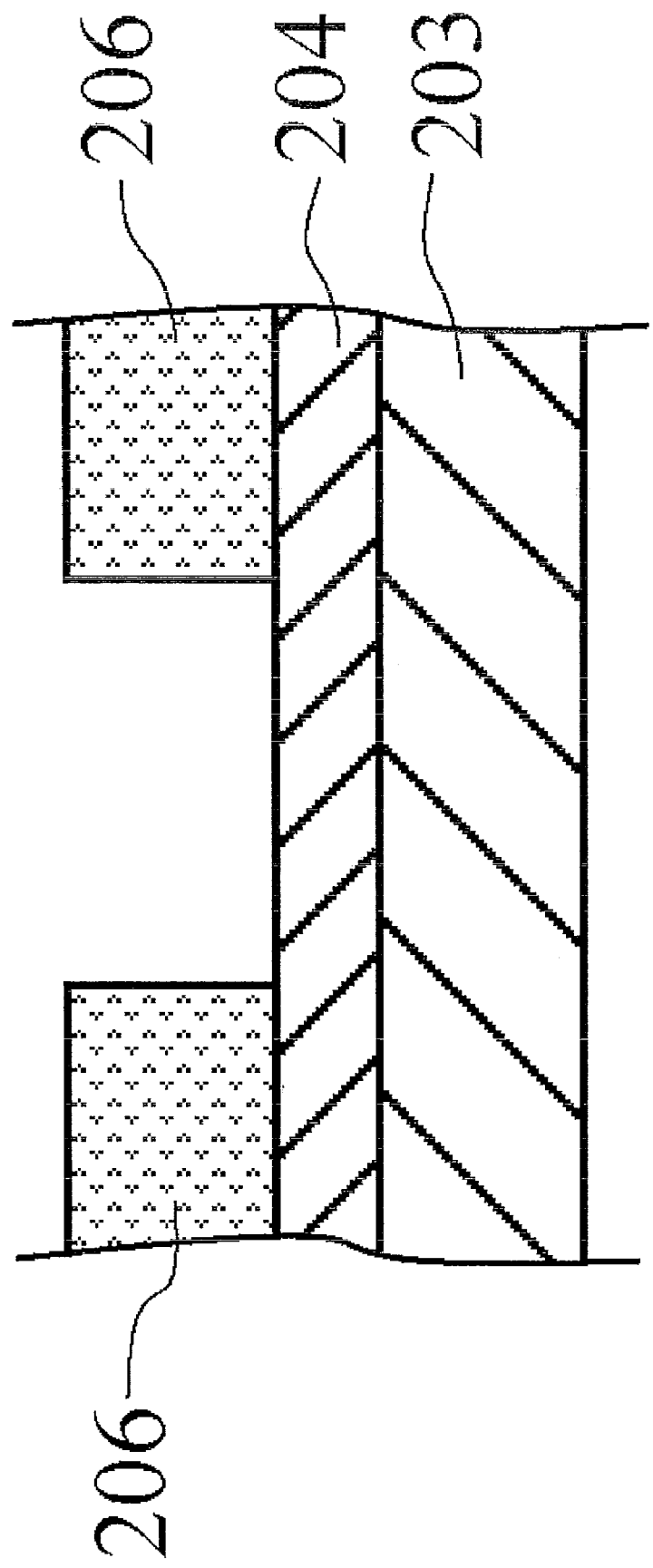
Figure 6D:
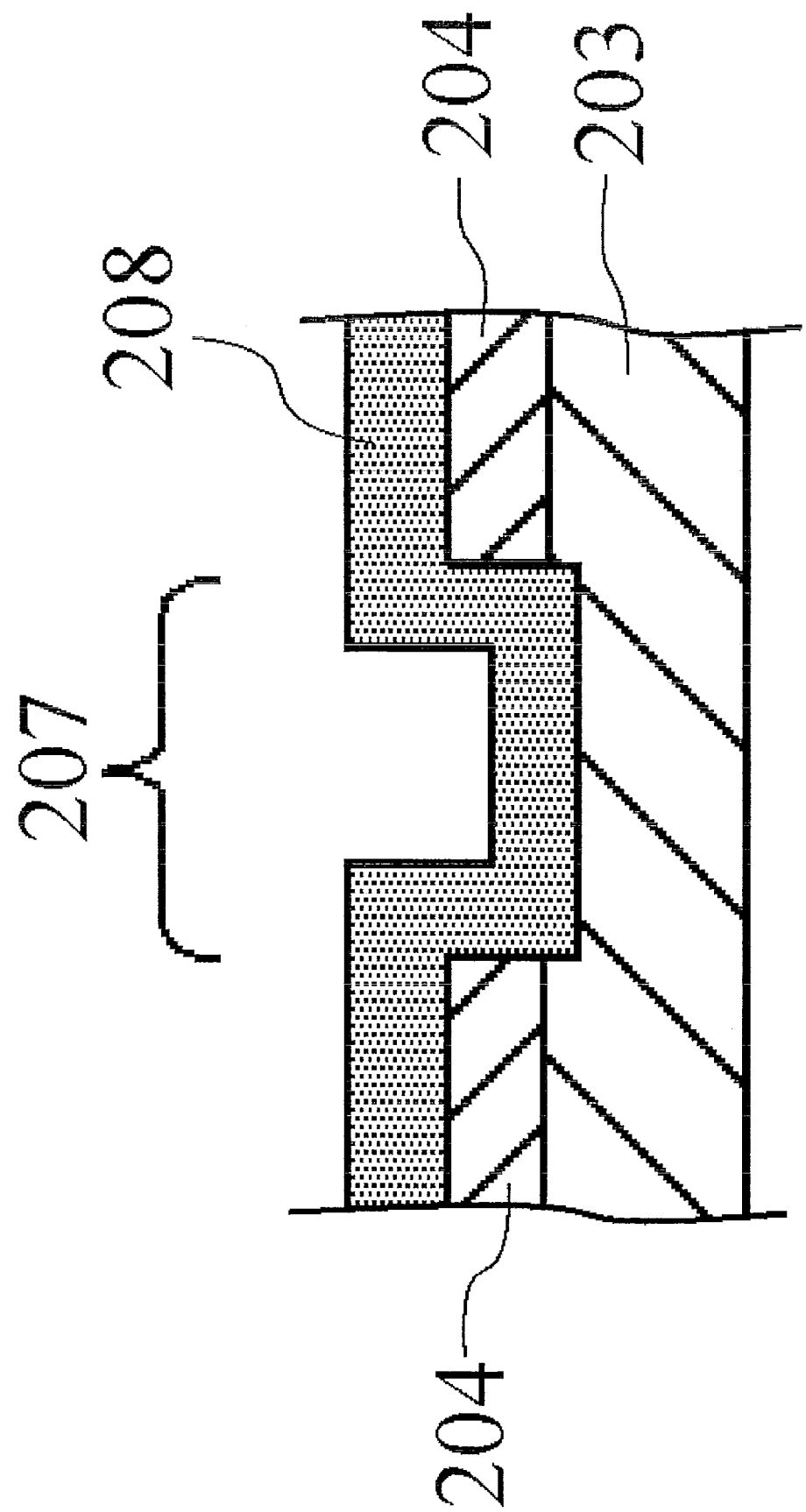
Figure 6E:
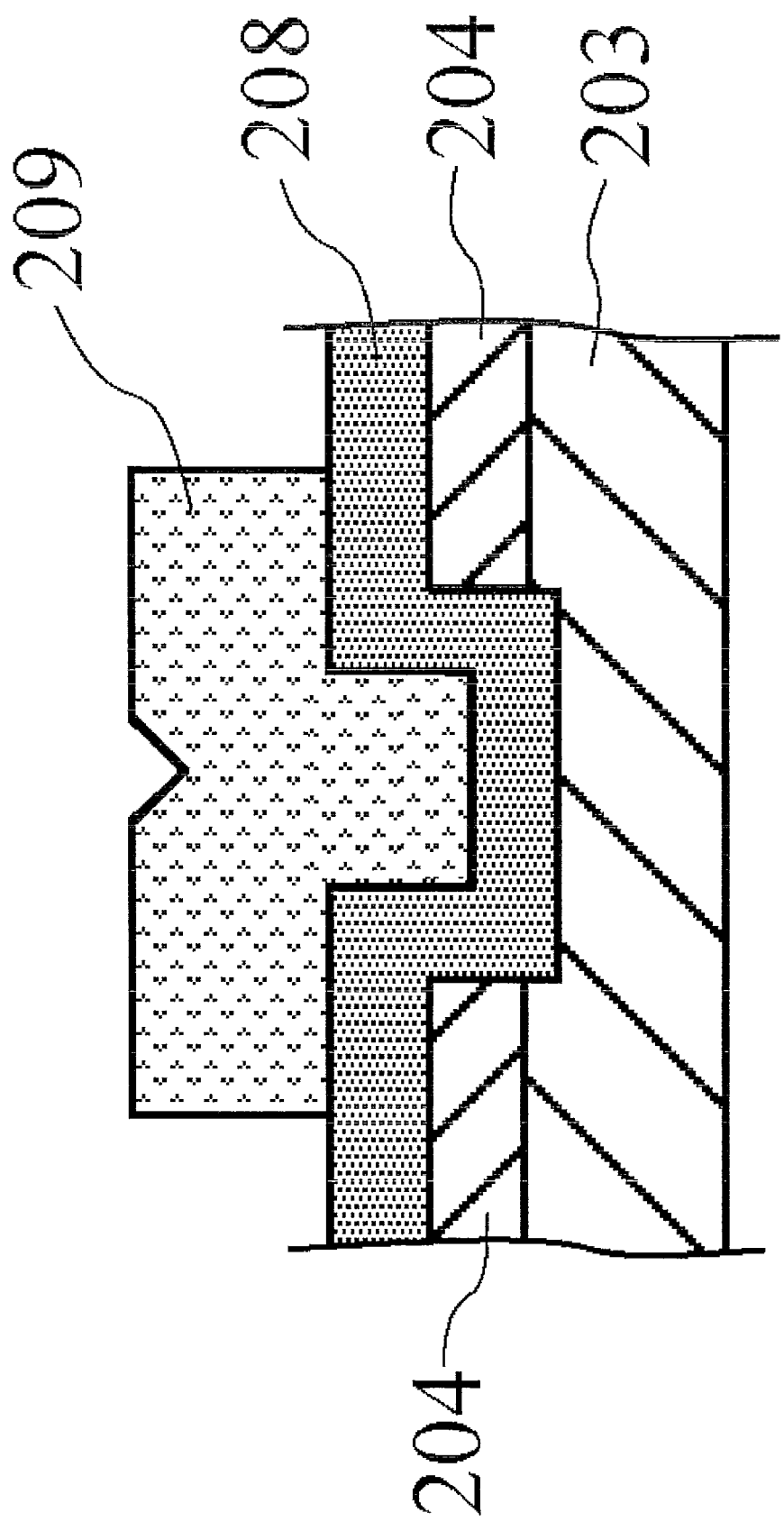
Figure 6F:
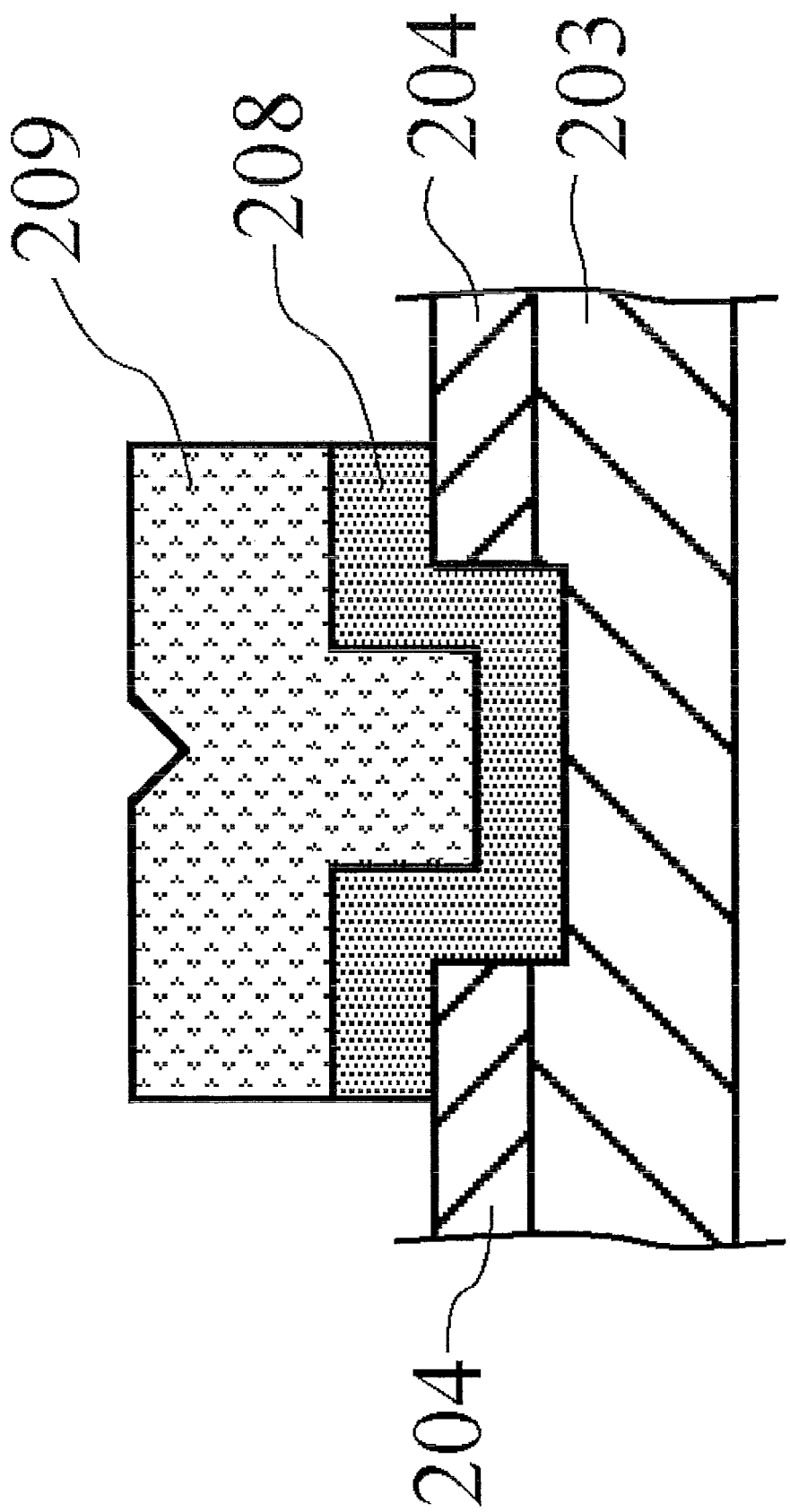

Then, in this state, an electrode material 105 is formed on the entire exposed surface as illustrated in FIG. 1G (electrode film formation process). The electrode material 105 is a material that can establish ohmic contact with the two dimensional electron gas and, for example, Ti is formed on the semiconductor layer side and Al is formed thereabove. The laminated structure of the electrode material 105 can be formed by a low-temperature deposition technique, such as an evaporation or sputtering method. At this time, it is preferable that the electrode material 105 goes into the hollow space under the photoresist pattern 104 as illustrated in FIG. 1G. To this end, a wafer in which this structure has been formed is preferably installed inclined with respect to an evaporation source and, further, the wafer is preferably configured to be able to rotate. As a result, the structure illustrated in FIG. 1G can be easily obtained. In the outside of the recessed region 110, an electrode 106 has a tapered cross-sectional shape, i.e., the surface of the electrode material 105 gradually decreases toward the outer periphery. The tapered portion extends from the recessed region 110 to the exposed surface of the semiconductor layer. For example, assuming that the thickness of the first insulating layer 103 is 0.25 μm, the length (length of each of the regions denoted by two-headed arrows of FIG. 1G) of the region (tapered portion) having the tapered shape can be set to 0.2 μm to 0.6 μm. Further, the taper angle ψ can be set to, e.g., 20° to 60°. While taper region corresponds to the overlapping region illustrated in FIG. 6G, it is formed in a self-aligned manner in the present manufacturing method. Further, the thickness of the electrode material 105 in the opening of the photoresist pattern 104 is substantially uniform, so that a flat portion is formed immediately under the opening portion.

Figure 1H:
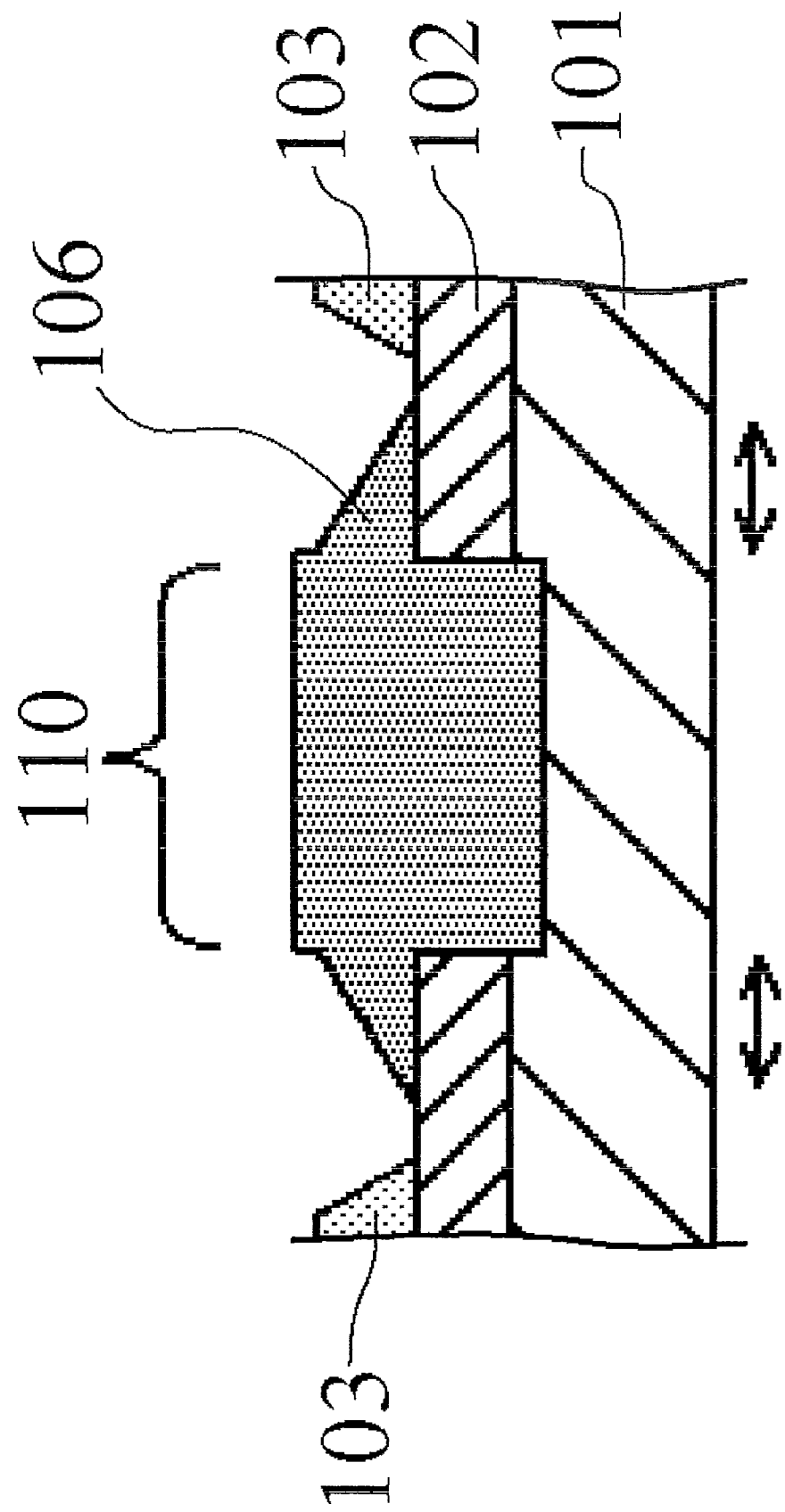

Then, as illustrated in FIG. 1H, the photoresist pattern 104 is removed (lift-off process). This process can be achieved by using, e.g., a photoresist remover. Although the electrode material 105 has been formed on the entire exposed surface in the state illustrated in FIG. 1G, the electrode material 105 on the photoresist pattern 104 is removed together with the photoresist pattern 104, whereby a patterned electrode 106 is formed. As described above, the upper surface of the electrode 106 has a flat portion formed at a portion corresponding to the opening of the photoresist pattern 104 and tapered region formed around the flat portion. The width of the flat portion is substantially equal to that of the bottom portion of the recessed region. The shape of the bottom surface of the electrode 106 is equal to the shape of the bottom portion of the recessed region and, accordingly, the width of the flat portion of the upper surface of the electrode 106 and that of the flat portion of the bottom surface thereof are substantially equal to each other and to the width of the opening of the photoresist pattern 104. The flat portion mentioned here is a region having a shape contrasting to that of the region having a shape tapered due to the above structure and includes substantially a flat portion in which slight surface unevenness has occurred due to the dry etching condition or film formation condition in the evaporation or sputtering method.

Figure 1I:
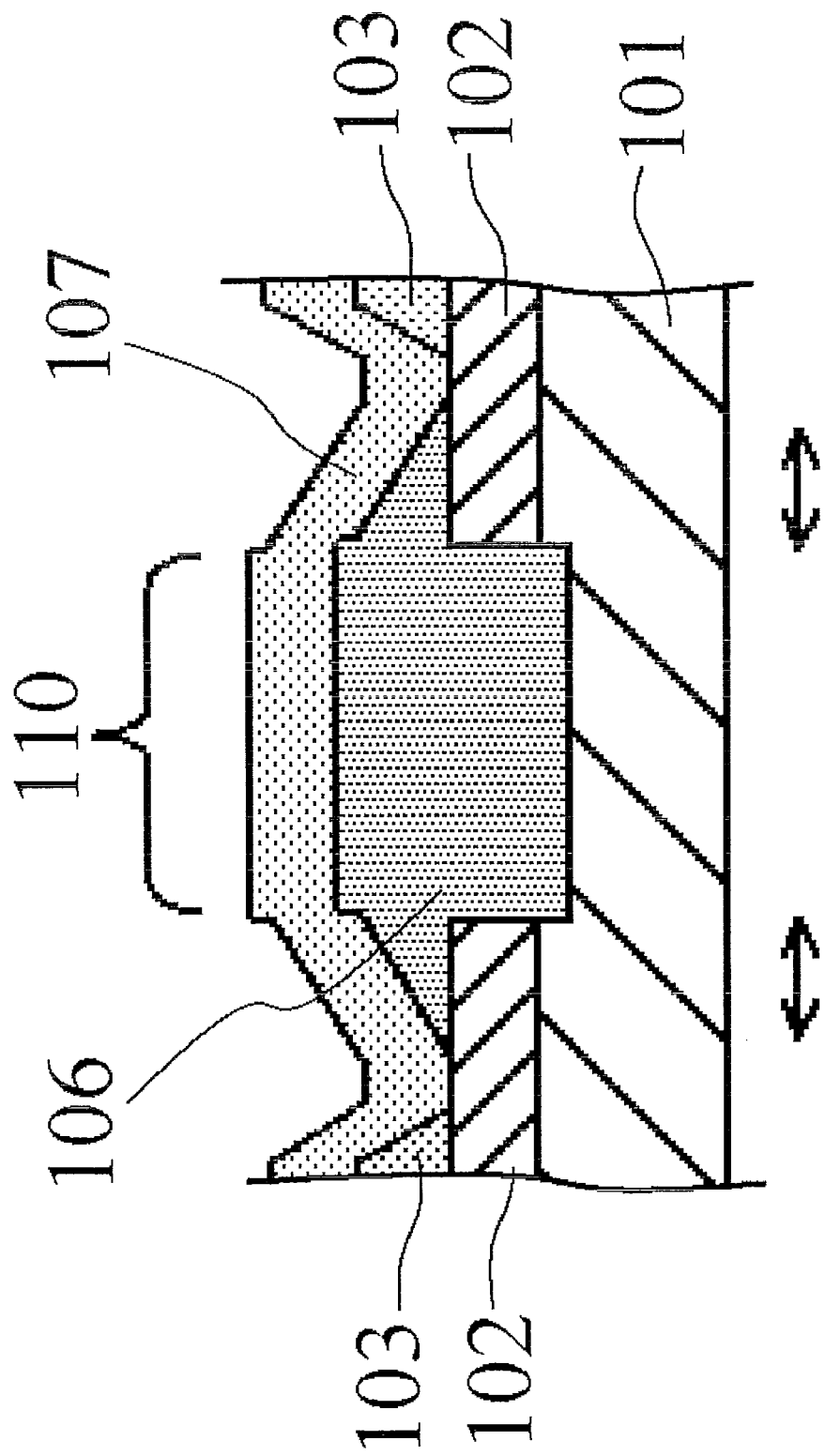

After that, as illustrated in FIG. 1I, a second insulating layer 107 is formed on the resultant structure (second insulating layer formation process). The second insulating layer 107 is made of a material same as that of the first insulating layer 103 and is formed by the similar method to that applied to the first insulating layer 103 with a thickness of about 250 nm. After that, thermal treatment is performed at a temperature of, e.g., about 500° C. for thirty minutes, whereby a satisfactory ohmic contact between the electrode 106 and GaN layer 101 can be obtained. Subsequently, for example, the second insulating layer 107 on a bonding pad connected to the electrode 106 is removed for connection to the outside. Any material may be used as the second insulating layer 107 as long as it can realize the structure of FIG. 1I. That is, the same material as the first insulating layer 103 need not be used as the second insulating layer 107. For example, the second insulating layer 107 may be $Si_3N_x$ (x is an index number close to 4).

According to the above manufacturing method, the electrode material 105 is formed on the entire exposed surface and is automatically formed also in the recessed region 110 as illustrated in FIG. 1G. In this state, the opening of the first insulating layer 103 is wider than that of the recessed region 110 as described above, so that it is possible to reliably form the electrode material 105 also near the side surface or end portion of the recessed region 110 by using the evaporation method or the like. That is, in this manufacturing method, when the recessed region is once formed, the electrode 106 is then formed in a self alignment manner. Therefore, it is not necessary to intentionally form the overlapping region. In other words, on-state resistance of a semiconductor device, such as HEMT, can be reduced.

Further, only one lithography process is required in the processes from the formation of the recessed region 110 to patterning of the electrode 106 (processes from FIGS. 1A to 1H), simplifying the entire manufacturing process.

Further, as illustrated in FIGS. 1G and 1H, in a state where the lift-off process is applied to pattern the electrode material 105, the hollow space exists outside the end of the recessed region due to lateral recession of the first insulating layer 103 by the side etching. If the photoresist pattern 104 has a sufficient thickness in the state of FIG. 1G, the electrode material 105 formed on the photoresist pattern 104 and the electrode material 105 formed in the recessed region 110 are completely separated from each other. This especially facilitates the application of the lift-off process. After the lift-off process, the first insulating layer may be removed by wet etching or the like.

If there is a portion at which the electrode 106 is exposed from the second insulating layer 107 in the thermal treatment process illustrated in FIG. 1I, there may be a case where the resistance of the electrode 106 itself is increased by being oxidized to degrade long-term reliability thereof. However, in the manufacturing method according to the present invention, the hollow space exists at the time of film formation of the electrode material 105 as illustrated in FIGS. 1F and 1G, so that the cross-sectional shape of the electrode 106 at the end portion of the recessed region is not abrupt but tapered as illustrated in FIG. 1G. Therefore, in the case where the second insulating layer 107 is formed after the formation of the electrode 106, the second insulating layer 107 can exhibit satisfactory coverage to make it difficult for the electrode 106 to be exposed from the second insulating layer 107. Thus, reliability of the semiconductor device having the above structure is increased.

Figure 2:
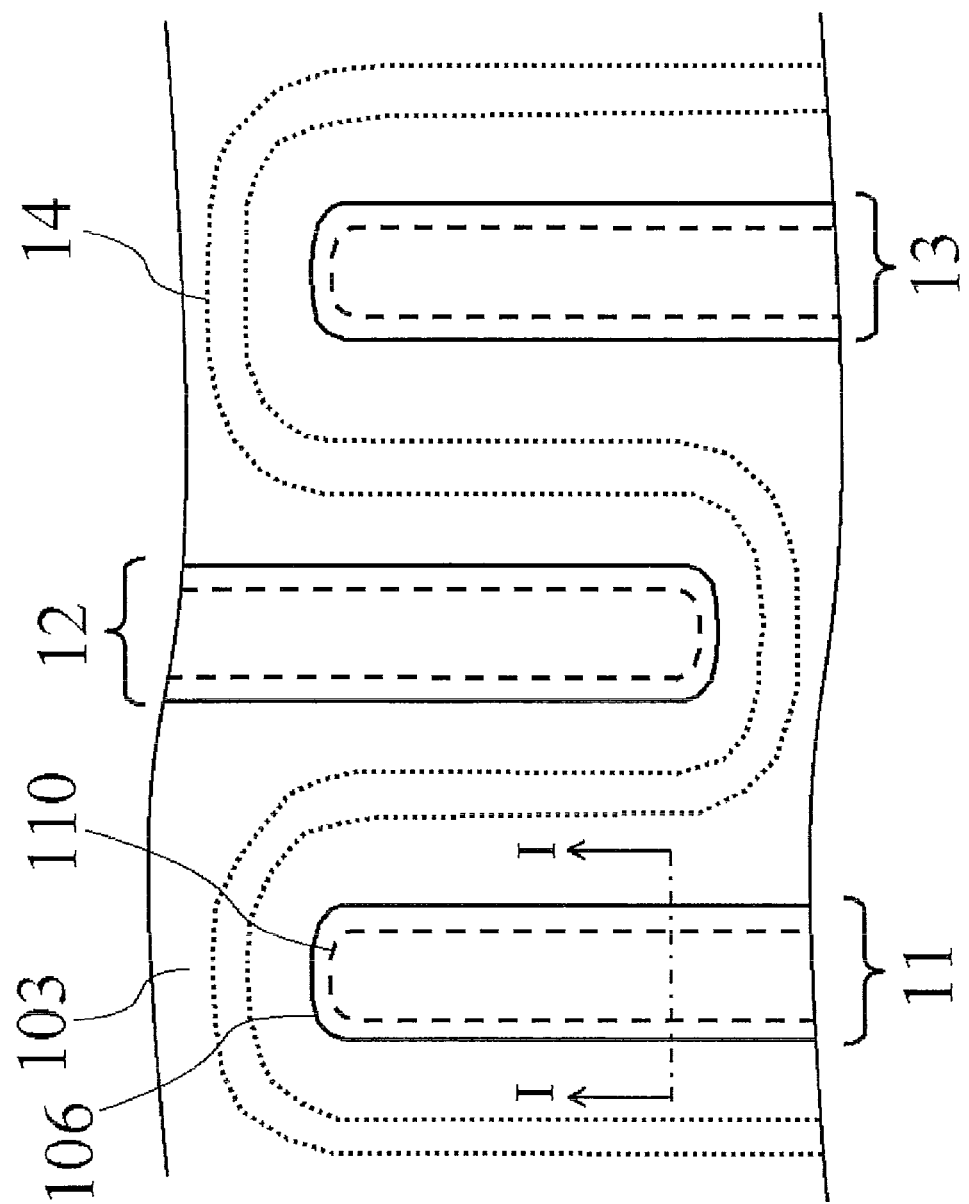
FIG. 2 is a view illustrating a semiconductor device according to embodiments of the present invention as viewed from the above.

The structure illustrated in FIGS. 1A to 1I is commonly applied to both the source and drain of the HEMT, or ohmic contact to a diode with similar structure. FIG. 2 illustrates an example of the structure of the HEMT in the state illustrated in FIG. 1H as viewed from the above. As illustrated in FIG. 2, a drain 11, a source 12, and a drain 13 are alternately arranged in a stripe pattern, and a gate 14 is formed between them as denoted by dotted lines. The positional relationship between the electrode 106 and recessed region 110 at each of the drain 11, drain 13, and source 12 is illustrated on the left side (at the portion around the drain 11) of FIG. 2 with reference numerals. The cross-sectional view taken along I-I line of FIG. 2 corresponds to FIG. 1H. The configurations around the drain 13 and source 12 are the same as that around the drain 11. That is, the electrode 106 having the large width than that of the recessed region 110 is formed in a self-aligned manner at all the drains and sources.

If the thickness of the electrode 106 formed in the process of FIG. 1G is insufficient at that stage, a metal material may additionally be formed after the process of FIG. 1I so as to increase the thickness. The formation of metal material can be achieved by plating after the removal of the second insulating layer 107 formed on the portion at which additional thickness is required.

Second Embodiment

It is apparent that the same effect can be obtained even when the insulating layer side etching process is performed after the lithography process (after the formation of the photoresist pattern 104) and before the semiconductor etching process (before forming recessed region 110 in AlGaN layer 102 and GaN layer 101) in the above manufacturing method. FIGS. 3A to 3H are process cross-sectional views illustrating a manufacturing method obtained by changing a part of the manufacturing method according to the first embodiment in this point of view. In the manufacturing method according to the present embodiment, the entire process has been further simplified as compared to the manufacturing method according to the first embodiment.

Figure 3B:
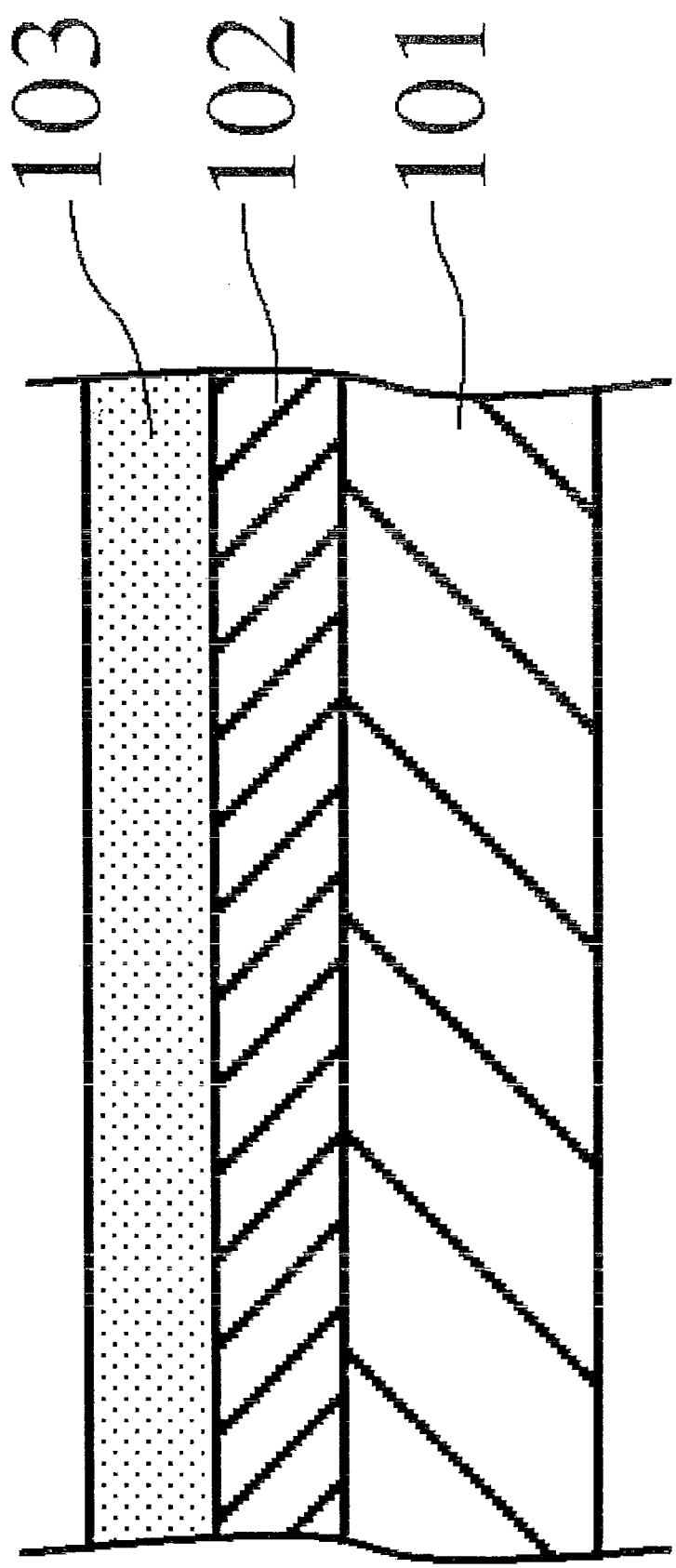
Figure 3C:
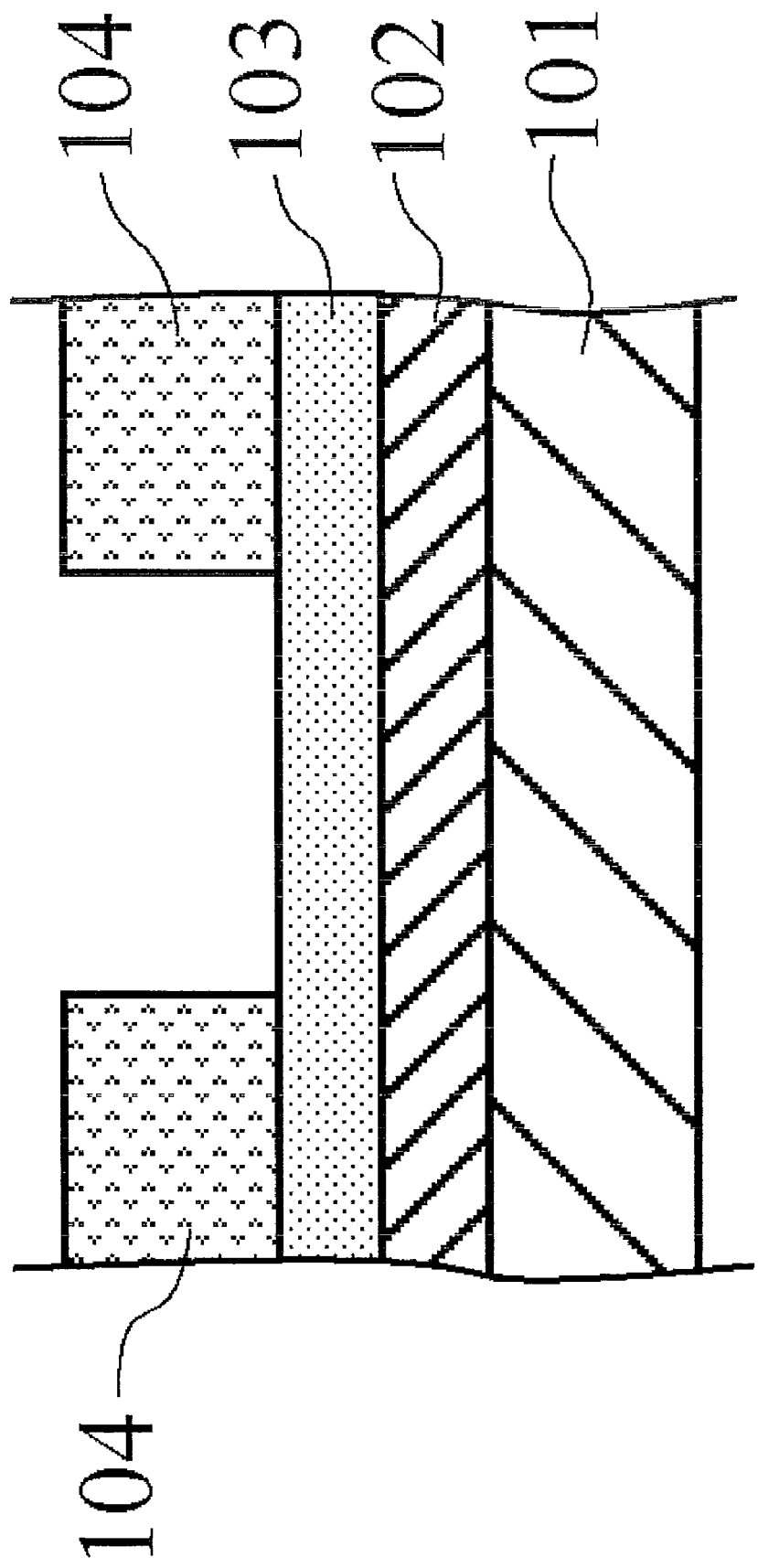

FIGS. 3A, 3B, and 3C are the same as FIGS. 1A, 1B, and 1C in the manufacturing method according to the first embodiment, and the descriptions thereof are omitted here.

Figure 3D:
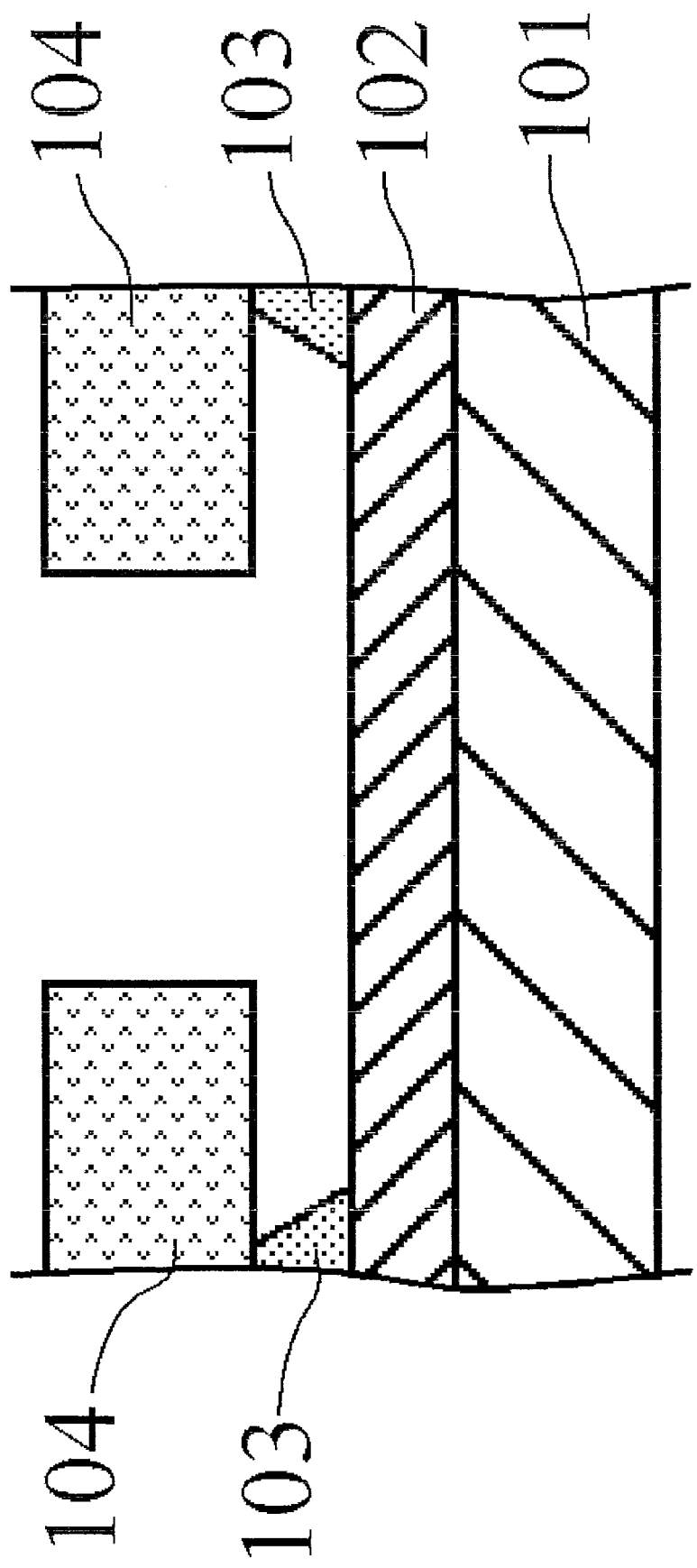

In FIG. 3D, the first insulating layer 103 is etched using the photoresist pattern 104 as a mask. While dry etching is performed in the first embodiment at this time, wet etching is performed in the present embodiment. As in the case of the process illustrated in FIG. 1F, the wet etching employed here can be performed using buffered hydrofluoric acid or the like. The wet etching is not anisotropic, so that etching proceeds in the vertical direction and the horizontal direction. Accordingly, the first insulating layer 103 is patterned to have a wider opening than the opening of the photoresist pattern 104 as illustrated in FIG. 3D. That is, in this case, the insulating layer side etching process serving also as the insulating layer etching process is performed before the semiconductor etching process to omit the insulating layer etching process.

Figure 3E:
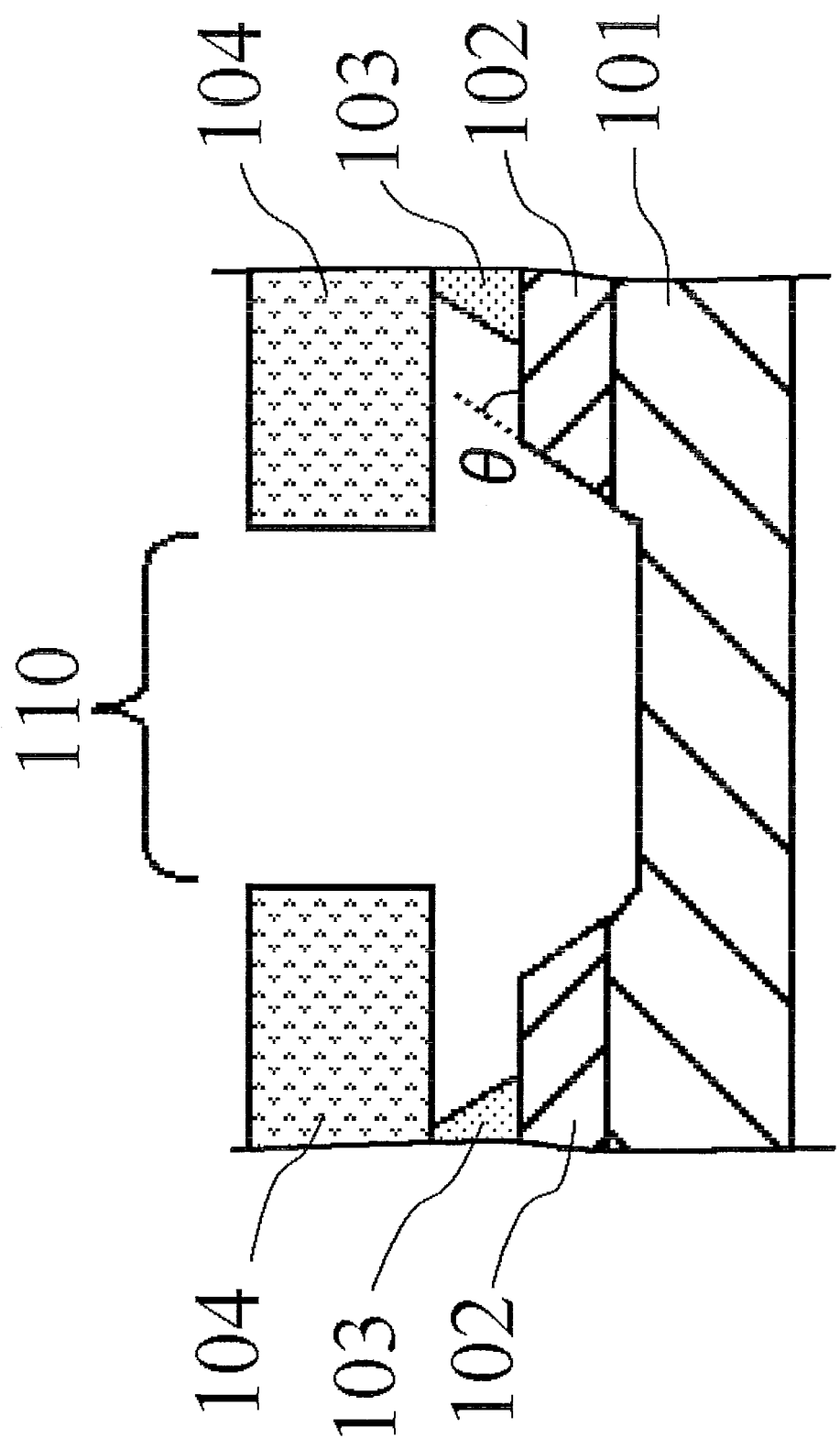

Then, in FIG. 3E, dry etching is applied to the AlGaN layer 102 and GaN layer 101 as in the process illustrated in FIG. 1E (semiconductor etching process). However, while the photoresist pattern 104 and first insulating layer 103 formed into a vertical shape have been used as a mask in FIG. 1E of the first embodiment, the photoresist pattern 104 located apart from the laminated semiconductor structure of the AlGaN layer 102 and GaN layer 101 by a distance corresponding to the thickness of the first insulating layer 103 is used as a mask in the present embodiment. Therefore, the anisotropy in the dry etching is weakened and thereby the shape of the side surface of the recessed region 110 is tapered more than in the case of FIG. 1E, whereby the shape as illustrated in FIG. 3E is obtained. In this case, in the semiconductor layer, the angle (taper angle) θ between the side surface of the recessed region 110 and upper surface thereof can be set to 20° to 80°. As in the case of the first embodiment, different etching gases may be used to etch the AlGaN layer 102 and GaN layer 101. The taper angle depends also upon the etching condition, so that it is possible to make the taper angle different between at the portions of the AlGaN layer 102 and GaN layer 101. That is, the taper angle or taper shape can arbitrarily be set. However, ion irradiated at the dry etching time uniformly vertically enters the opening of the photoresist pattern 104, so that the bottom surface of the recessed structure immediately under the opening becomes substantially flat.

Figure 3F:
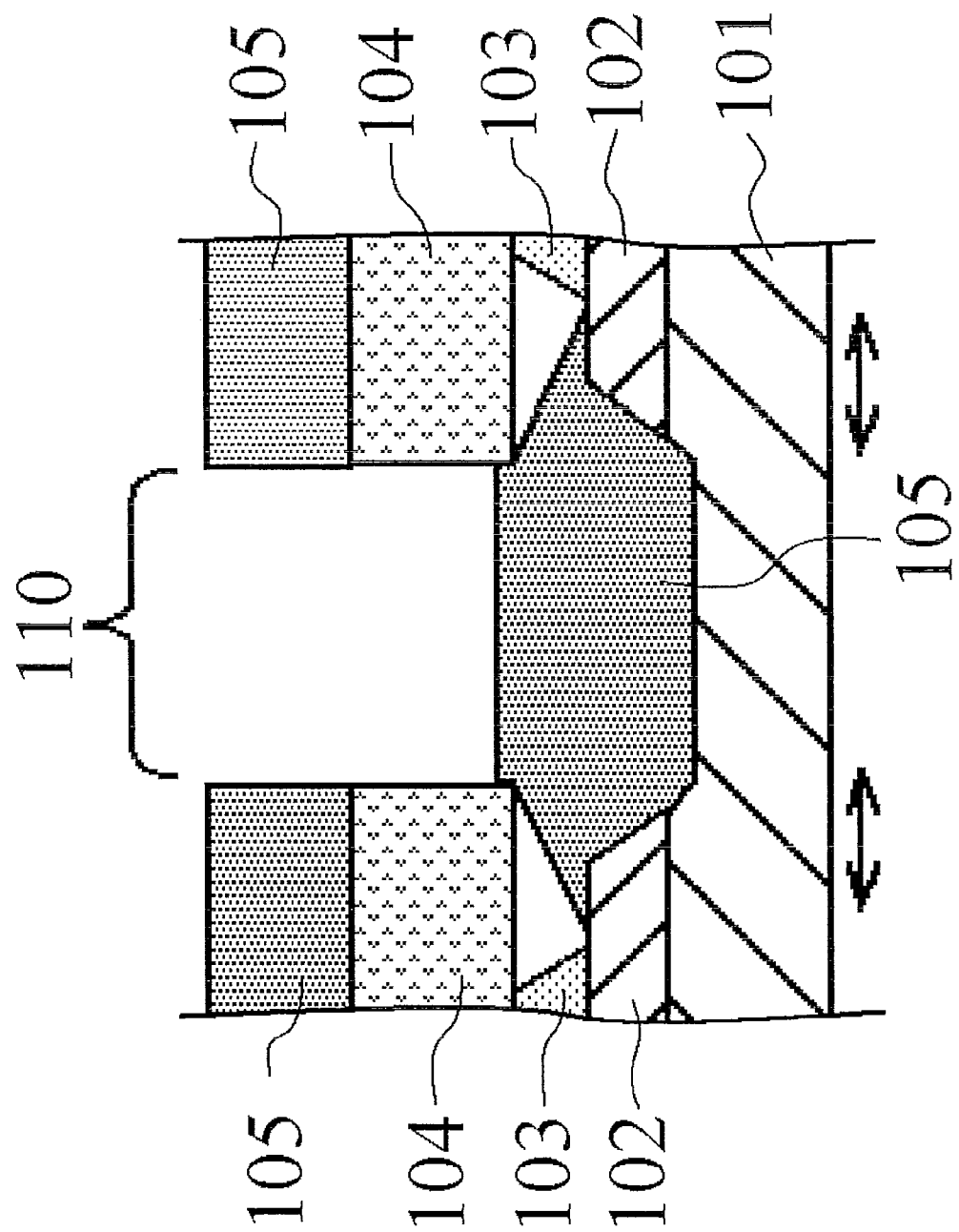

Thereafter, the electrode material 105 is formed in the same manner as in the process of FIG. 1G as illustrated in FIG. 3F, and lift-off process is performed in the same manner as in the process of FIG. 1H as illustrated in FIG. 3G, whereby the patterned electrode 106 is formed. At this time, as in the case of the first embodiment, a substantially flat portion is formed on the upper surface of the electrode 106 at a portion corresponding to the opening of the photoresist pattern 104, and a region (tapered portion) having a tapered shape is formed around the substantially flat portion. The width of the substantially flat portion is substantially equal to that of the bottom portion of the recessed region. Further, the shape of the bottom surface of the electrode 106 is equal to the shape of the bottom portion of the recessed region and, accordingly, a tapered region is also formed around the bottom portion of the recessed region unlike the case of the first embodiment. However, as described above, the width of the substantially flat portion of the bottom portion is substantially equal to the width of the opening of the photoresist pattern 104 and to the width of the flat portion of the upper surface.

Figure 3H:
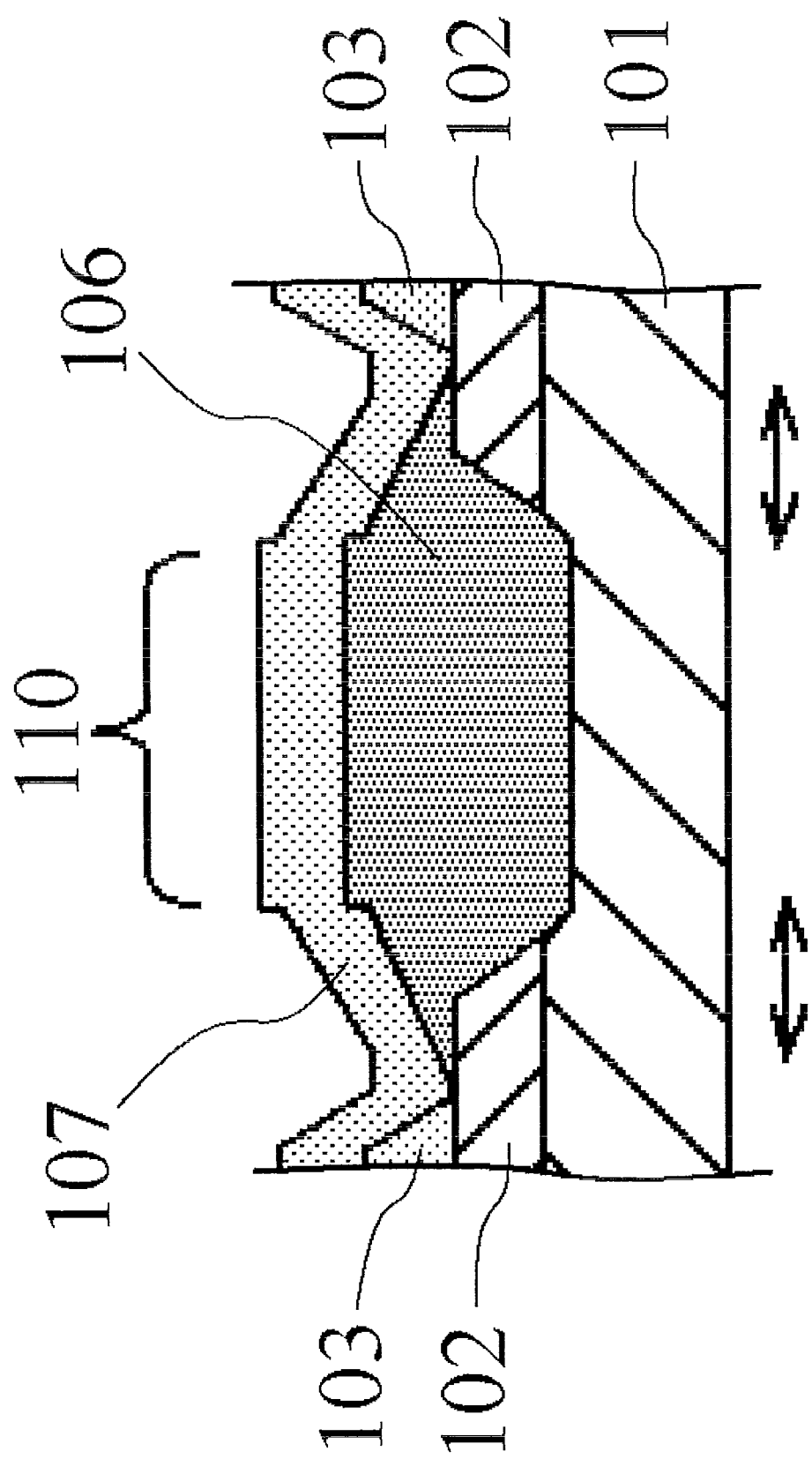

In FIG. 3H, the second insulating layer 107 is formed followed by thermal treatment as in the process illustrated in FIG. 1I. Thus, with the manufacturing method according to the second embodiment, it is possible to obtain a semiconductor device with both low on-state resistance and high reliability as in the case of the manufacturing method according to the first embodiment.

Unlike the manufacturing method of the first embodiment, according to the manufacturing method of the second embodiment, it is possible to manufacture the semiconductor device without applying dry etching to the first insulating layer 103. Therefore, the manufacturing method can be simplified as compared to the first embodiment. Further, as in the case of the first embodiment, it is preferable that the cleaning process be carried out between the semiconductor etching process and electrode film formation process.

Although the shape of the electrode 106 formed in the manufacturing method according to the present embodiment differs from that of the electrode 106 formed in the first embodiment, a configuration in which the bottom surface of the electrode 106 contacting the bottom surface (channel layer) of the recessed structure and upper surface thereof have substantially flat portions of the same widths is the same as in the first embodiment. That is, according to the manufacturing method of the second embodiment, a semiconductor device having the above configuration can be obtained. Further, a configuration in which the tapered portion is formed around the flat portion of the upper surface of the electrode is the same as in the first embodiment. As described above, the first insulating layer may be removed after the lift-off process. If not removed, the first insulating layer remains around the tapered portion.

(Electrode Shape)

Figure 4A:
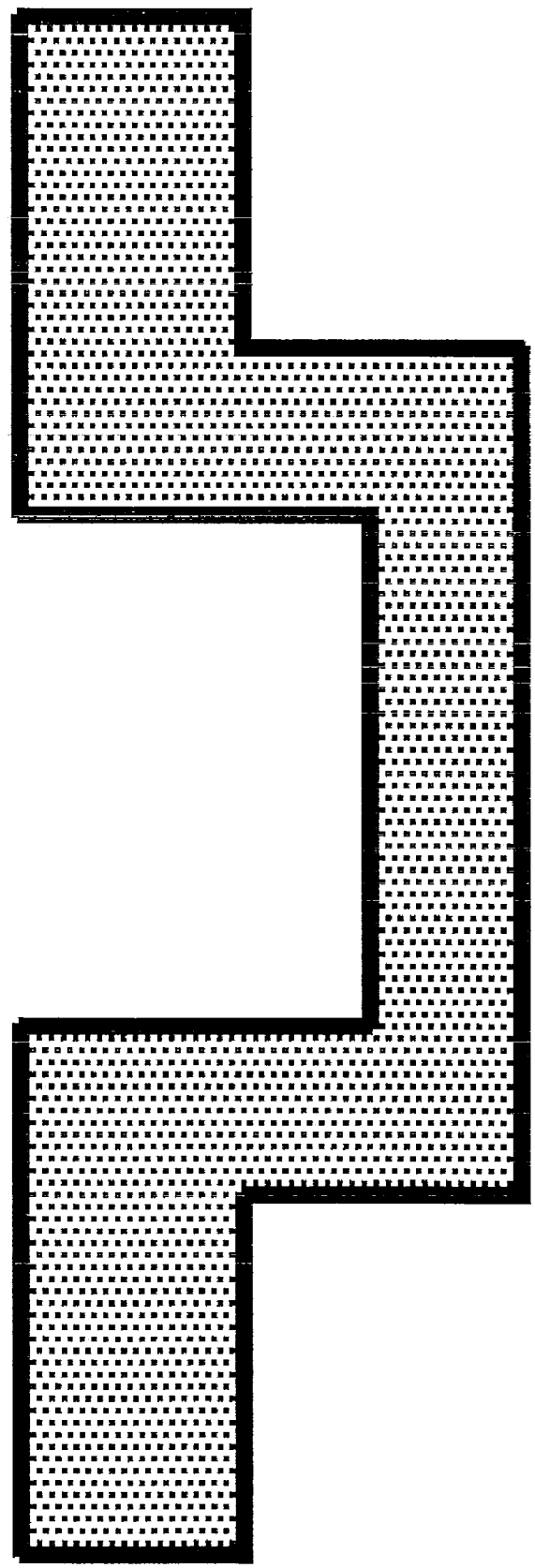
FIGS. 4A to 4D are views comparing the cross-sectional shape of an electrode formed by the manufacturing method according to the embodiments of the present invention and cross-sectional shape of an electrode formed by a conventional manufacturing method.
Figure 4B:
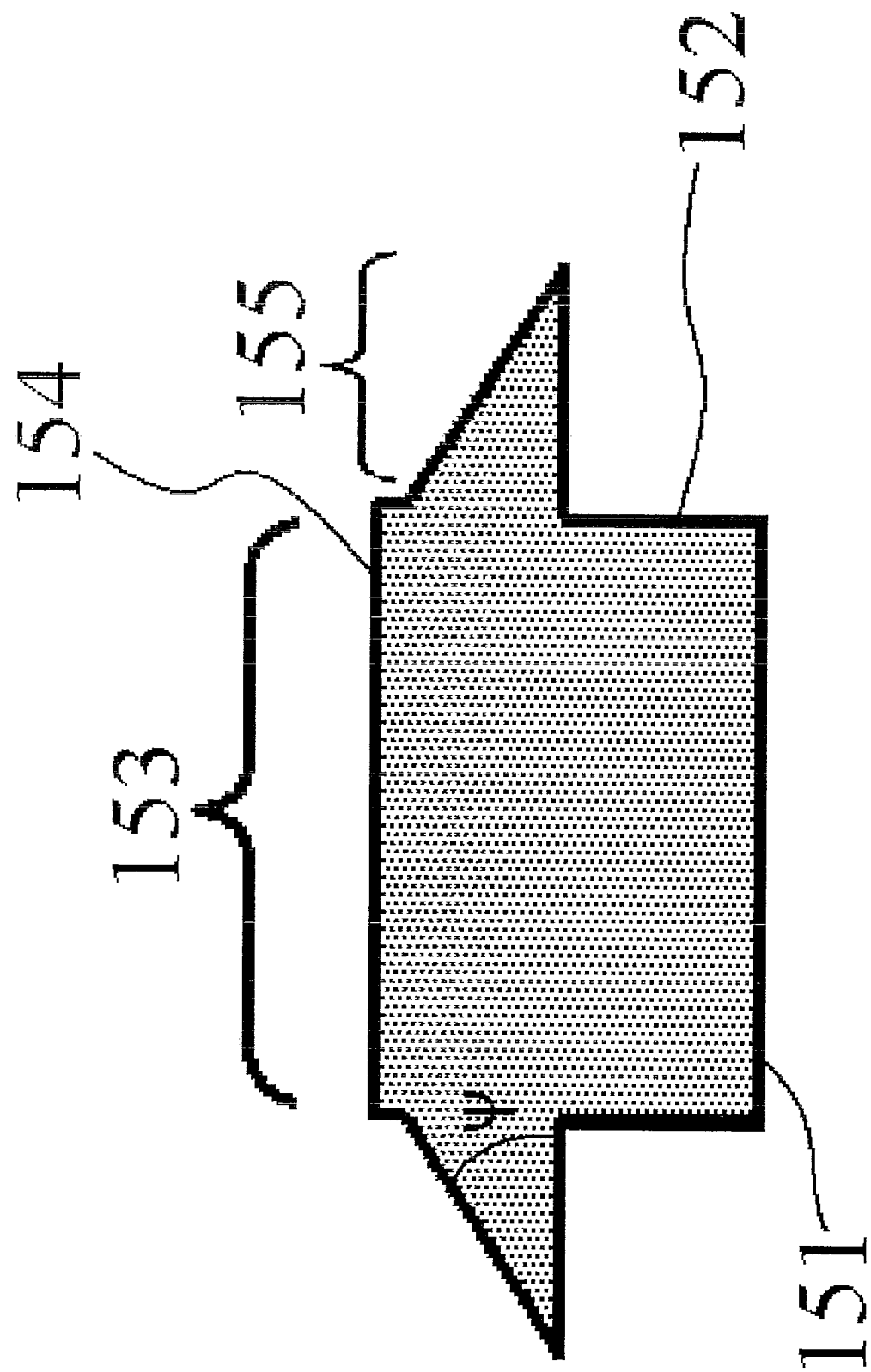
Figure 4C:
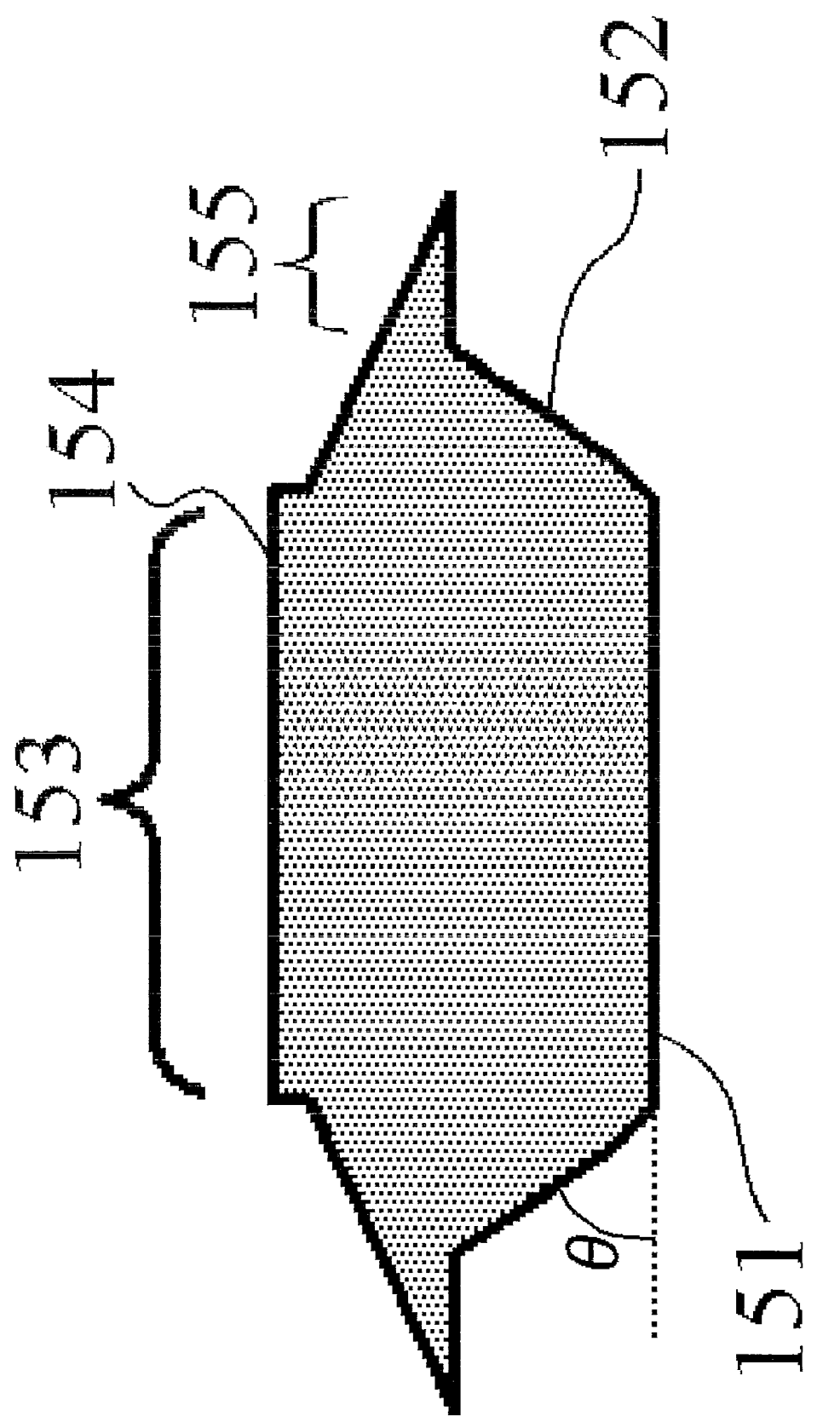

FIGS. 4A to 4D are views comparing the cross-sectional shape of the electrode formed by the conventional manufacturing method and cross-sectional view of the electrode formed by the manufacturing methods of the above two embodiments. FIG. 4A illustrates the cross-sectional shape of the electrode formed by the conventional manufacturing method illustrated in FIGS. 6A to 6G, FIG. 4B illustrates the cross-sectional view of the electrode formed by the manufacturing method illustrated in FIGS. 1A to 1I, and FIG. 4C illustrates the cross-sectional view of the electrode formed by the manufacturing method illustrated in FIGS. 3A to 3H. According to the conventional manufacturing method illustrated in FIGS. 6A to 6G, an electrode material 208 is formed in a conformal manner on the bottom side surfaces in the recessed structure and around the recessed structure, so that the upper surface of the electrode material 208 is depressed at the center of the recessed structure. On the other hand, according to the manufacturing methods of FIGS. 1A to 1I and 3A to 3H, the electrode material is formed in a self-alignment manner with respect to the recessed region and is formed to have a sufficient thickness relative to the recess depth, so that the a depression does not exist as illustrated in FIGS. 4B and 4C.

Thus, the electrode formed by the manufacturing method according to the embodiments of the present invention includes, as illustrated in FIGS. 4B and 4C, a bottom surface portion 151 contacting the bottom surface of the recessed structure or provided in the channel layer, a side surface portion 152 contacting the side surface of the recessed structure and meeting the bottom surface portion 151, an upper surface portion 154 having a flat portion 153 opposed to the bottom surface portion 151 and existing at the upper side, and a tapered portion 155 existing outside the upper surface portion 154. The tapered portion 155 lies adjacent to the side surface portion 152 and upper surface portion 154 and extends toward the upper surface of the semiconductor layer. The thickness of the electrode becomes maximum at the flat portion 153. The upper surface of the electrode may be inclined downward in a stepwise or gradual manner to accordingly reduce the thickness of the electrode, or the tapered portion 155 may continue from the flat portion 153. Although a flat portion is formed in the upper surface of the electrode formed by the conventional manufacturing method illustrated in FIG. 5, it is located below its surrounding portion and therefore the thickness of the electrode at this portion does not become maximum. As described above, the formation of the flat portion 153 or tapered portion 155 on the surface of the electrode exerts favorable influence on the coating performance of the second insulating layer 107.

Figure 4D:
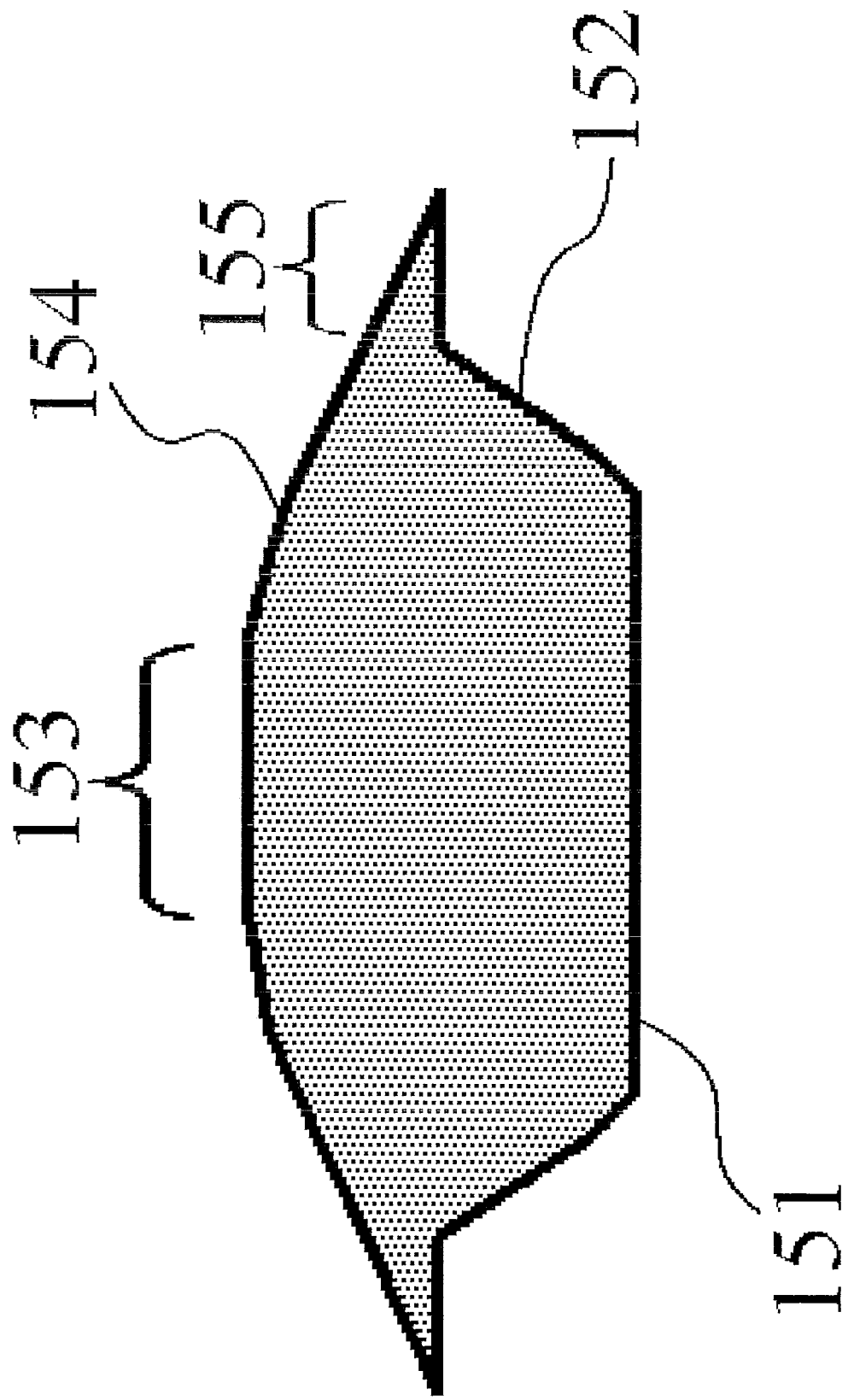

Although FIGS. 4B and 4C illustrate a case where the most part of the upper surface portion 154 is the flat portion 153, there may be a case where the flat portion 153 becomes smaller to cover a small portion of the upper surface portion 154 depending on the formation method of the electrode material 105 as illustrated in FIG. 4D. In this case, the upper surface portion 154 has a convex shape protruding upward as a whole, and the upper surface portion 154 and tapered portion 155 are continued to each other. However, in this configuration, a portion at which the surface height is abruptly changed as illustrated in FIG. 4A does not exist, so that satisfactory coverage of the second insulating layer 107 can be obtained as in the first and second embodiments.

Such a shape of the electrode exerts favorable influence on the operation of the device in addition to the coverage. For example, electric field concentration is likely to occur at the drain electrode end portion near the gate electrode at the HEMT operation time, causing occurrence of leak current or breakage of the electrode (the electrode end portion mentioned here is a portion at which the bottom surface portion 151 of the electrode and side surface portion 152 thereof meet each other in the configuration of FIG. 4B and the like). However, the tapered portion 155 exists in the configurations of FIGS. 4B, 4C, and 4D. This tapered portion 155 produces field plate effect that relaxes the electric field concentration. Thus, the formation of the tapered portion 155 increases breakdown voltage of the device and reliability thereof. This can be said commonly to both the cases where the angle between the bottom surface portion 151 and side surface portion 152 is substantially vertical (FIG. 4B) and where the taper angle between the bottom surface portion 151 and side surface portion 152 is set to 20° to 80° (FIGS. 4C and 4D). In the latter case, the distance between the two-dimensional electron gas and electrode is gradually changed by existence of the tapered side surface portion 152, thereby producing the field plate effect also at this portion. Thus, the breakdown voltage of the device and reliability thereof are increased.

Although the first insulating layer 103 is formed on the AlGaN layer 102 serving as a carrier supply layer in the above first and second embodiments, the same effect can be obtained even in a configuration where another semiconductor layer such as a cap layer is formed on the AlGaN layer 102 and the first insulating layer 103 is formed on the cap layer. As the cap layer, an AlGaN layer or GaN layer having an Al composition x lower than that of the carrier supply layer may be used. This layer may be doped or non-doped, may have a configuration in which Al composition or doping amount changes in the thickness direction, or may have a multilayered structure. For example, the layer may have a multilayered structure including an Si-doped layer with x=0 (GaN) and having a thickness of 2 nm at the semiconductor surface side, and a non-doped layer with x=0.1 and having a thickness of 3 nm at the AlGaN layer 102 side.

Further, the AlGaN layer 102 serving as a carrier supply layer may have a multilayer structure. In this case, the AlGaN layer 102 may include a non-doped layer with x=0.26 and having a thickness of 7 nm as the lower side and a non-doped layer with x=0.3 and having a thickness of 18 nm at the upper side. Further, an AlN spacer layer may be formed between the GaN layer 101 and AlGaN layer 102.

Although the etching condition in the process (semiconductor etching process) of forming the recessed region 110 differs, the same manufacturing process can be applied to any of the above cases.

The first and second insulating layers 103 and 107 may be made of any material other than $SiO_x$ as long as it can be coated on the semiconductor in the same manner and it can be subjected to dry etching or wet etching in the same manner.

In the above examples, the HEMT uses GaN as a channel layer and AlGaN as a carrier supply layer. However, the present invention can be applied in the same manner to any semiconductor device that needs to establish a contact (electrical contact) at the side surface of the recessed structure by using the two-dimensional electron gas and, even in this case, the same effect can be obtained. For example, the present invention can also be applied to an HEMT that uses GaAs or InGaN as a channel layer and AlGaAs or AlInGaN as a carrier supply layer.

Further, the present invention can be applied not only to the HEMT but to any semiconductor device having an electrode in the recessed structure formed in the semiconductor layer. For example, the present invention can also be applied to a MESFET (MEtal Semiconductor Field Effect Transistor), a diode, etc.

What is claimed is:

1. A semiconductor device in which an electrode is embedded in a recessed structure formed in a semiconductor layer with a layer structure including an electron running layer in which a two-dimensional electron gas is formed and an electron supplying layer having a lattice constant smaller than that of the electron running layer, wherein
the electrode includes:
a bottom surface portion contacting the bottom surface of the recessed structure, formed in the electron running layer;
a side surface portion contacting the side surface of the recessed structure;
an upper surface portion having a flat portion opposed to the bottom surface portion and existing at the upper side; and
a tapered portion extending from the periphery of the upper surface portion toward the upper surface of the semiconductor layer, in which the height of surface of the electrode becomes lower toward the outer periphery.

2. The semiconductor device according to claim 1, wherein the angle between the side surface portion and bottom surface portion is substantially vertical.

3. The semiconductor device according to claim 1, wherein the taper angle between the side surface portion and bottom surface portion is in the range of 20° to 80°.

4. The semiconductor device according to claim 1, wherein the tapered portion lies adjacent to the side surface portion and upper surface portion.

5. The semiconductor device according to claim 1, wherein the thickness of the electrode becomes maximum at the flat portion.

6. The semiconductor device according to claim 1, wherein the two-dimensional electron gas is in contact with the electrode on the side surface of the recess structure.

* * * * *